(12) United States Patent
Lee et al.

(10) Patent No.: US 10,693,055 B2
(45) Date of Patent: Jun. 23, 2020

(54) MAGNETIC MEMORY DEVICES

(71) Applicant: Samsung Electronics Co., Ltd., Suwon-si, Gyeonggi-do (KR)

(72) Inventors: Kilho Lee, Busan (KR); Gwanhyeob Koh, Seoul (KR); Yoonjong Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/202,360

(22) Filed: Nov. 28, 2018

(65) Prior Publication Data

US 2020/0083429 A1 Mar. 12, 2020

(30) Foreign Application Priority Data

Sep. 12, 2018 (KR) .................. 10-2018-0109083

(51) Int. Cl.
| | |
|---|---|
| *H01L 43/02* | (2006.01) |
| *H01L 43/12* | (2006.01) |
| *H01L 43/10* | (2006.01) |
| *H01L 27/22* | (2006.01) |

(52) U.S. Cl.
CPC ............ *H01L 43/02* (2013.01); *H01L 27/228* (2013.01); *H01L 43/10* (2013.01); *H01L 43/12* (2013.01)

(58) Field of Classification Search
CPC ....... H01L 43/08; H01L 43/12; H01L 27/228; H01L 27/222; H01L 43/02; G11C 11/161; G11C 11/1675; G11C 11/16
USPC ....... 257/E43.004, 421; 438/3; 365/171, 173
See application file for complete search history.

(56) References Cited

U.S. PATENT DOCUMENTS

| | | | |
|---|---|---|---|
| 9,076,537 B2 | 7/2015 | Khvalkovskiy et al. | |
| 9,076,954 B2 | 7/2015 | Khvalkovskiy et al. | |
| 9,490,297 B1 | 11/2016 | Braganca et al. | |
| 9,542,987 B2 | 1/2017 | Naik et al. | |
| 9,608,039 B1 | 3/2017 | Apalkov et al. | |
| 9,768,229 B2 | 9/2017 | Braganca et al. | |
| 9,830,966 B2 | 11/2017 | Mihajlovic et al. | |
| 9,966,122 B2* | 5/2018 | Shirotori ................. | H01L 43/12 |
| 2014/0153324 A1* | 6/2014 | Yu ........................... | H01L 43/02 365/158 |
| 2014/0169088 A1* | 6/2014 | Buhrman ............... | G11C 16/30 365/158 |
| 2018/0040812 A1 | 2/2018 | Shimizu et al. | |
| 2018/0123024 A1 | 5/2018 | Sasaki et al. | |
| 2018/0123031 A1 | 5/2018 | Adelmann et al. | |
| 2018/0145691 A1 | 5/2018 | Manipatruni et al. | |

FOREIGN PATENT DOCUMENTS

KR 1020150018413 2/2015

* cited by examiner

*Primary Examiner* — Jonathan Han
(74) *Attorney, Agent, or Firm* — Myers Bigel, P.A.

(57) ABSTRACT

Magnetic random access memory (MRAM) devices are provided. The MRAM devices may include a magnetic tunnel junction (MTJ) including a free layer and a pinned layer sequentially stacked in a vertical direction and a conductive layer adjacent to the free layer of the MTJ. The conductive layer may include a horizontal portion and first and second protruding portions that protrude away from the horizontal portion and are spaced apart from each other in a horizontal direction that is perpendicular to the vertical direction. A side of the free layer and a side of the horizontal portion may form a straight side.

20 Claims, 22 Drawing Sheets

MAGNETIC MEMORY DEVICES

CROSS-REFERENCE TO RELATED APPLICATION

This U.S. non-provisional patent application claims priority under 35 U.S.C. § 119 to Korean Patent Application No. 10-2018-0109083, filed on Sep. 12, 2018, in the Korean Intellectual Property Office, the disclosure of which is hereby incorporated by reference herein in its entirety.

FIELD

The present disclosure generally relates to the field of electronics, and more particularly, to a magnetic memory device.

BACKGROUND

With increasing demand for electronic devices with increased speed and/or reduced power consumption, semiconductor memory devices with faster operating speed and/or lower operating voltages have been researched. Magnetic memory devices have been researched as a candidate. Magnetic memory devices can provide technical advantages, for example, high speed and/or non-volatility, and thus magnetic memory devices may emerge as next-generation memory devices. Therefore, developing manufacturing process for mass production of magnetic memory devices and developing magnetic memory devices having a high integration density and/or low power consumption may be beneficial.

Magnetic memory devices include a magnetic tunnel junction (MTJ). The MTJ includes two magnetic layers and an insulating layer interposed between the two magnetic layers. Resistance of the MTJ varies depending on magnetization directions of the magnetic layers. For example, the resistance of the MTJ is higher when magnetization directions of the magnetic layers are anti-parallel to each other than when they are parallel to each other. Such a difference in resistance can be used for data storing operations of the magnetic memory devices.

SUMMARY

Some embodiments of the present inventive concept provide magnetic memory devices having a low defect density and methods of fabricating the same.

Some embodiments of the present inventive concept provide methods of reducing difficulty in a process of fabricating a magnetic memory device and magnetic memory devices fabricated thereby.

According to some embodiments of the present inventive concept, magnetic random access memory (MRAM) devices may include a magnetic tunnel junction (MTJ) including a free layer and a pinned layer sequentially stacked in a vertical direction and a conductive layer adjacent to the free layer of the MTJ. The conductive layer may include a horizontal portion and first and second protruding portions that protrude away from the horizontal portion and are spaced apart from each other in a horizontal direction that is perpendicular to the vertical direction. A side of the free layer and a side of the horizontal portion may form a straight side.

According to some embodiments of the present inventive concept, magnetic random access memory (MRAM) devices may include a magnetic tunnel junction (MTJ) including a free layer and a pinned layer sequentially stacked in a vertical direction and a conductive layer adjacent to the free layer of the MTJ. The conductive layer may include a horizontal portion including a first surface facing the MTJ and a second surface opposite the first surface and first and second protruding portions that protrude away from the second surface of the horizontal portion and are spaced apart from each other in a horizontal direction that is perpendicular to the vertical direction. The first protruding portion may include a first side facing the second protruding portion and a second side opposite the first side of the first protruding portion, and the second side of the first protruding portion may be recessed toward the second protruding portion with respect to a side of the horizontal portion in a plan view.

According to some embodiments of the present inventive concept, magnetic random access memory (MRAM) devices may include a magnetic tunnel junction (MTJ) including a free layer and a pinned layer sequentially stacked in a vertical direction and a conductive layer adjacent to the free layer of the MTJ. The conductive layer may include a horizontal portion including a first surface facing the MTJ and a second surface opposite the first surface and first and second protruding portions that protrude away from the second surface of the horizontal portion and are spaced apart from each other in a horizontal direction that is perpendicular to the vertical direction. The MTJ may overlap an interface between the horizontal portion and the first protruding portion.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 10A to 14A are plan views illustrating a method of fabricating a magnetic memory device, according to some embodiments of the present inventive concept.

FIGS. 10B to 14B are cross-sectional views taken along the lines I-I' of FIGS. 10A to 14A, respectively.

FIGS. 17A to 19A are plan views illustrating a method of fabricating a magnetic memory device, according to some embodiments of the present inventive concept.

FIGS. 17B to 19B are cross-sectional views taken along the lines I-I' of FIGS. 17A to 19A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positions of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concept will now be described more fully with reference to the accompanying drawings, in which example embodiments are shown.

As used herein the term "and/or" includes any and all combinations of one or more of the associated listed items.

It will be understood that "an element A covers a surface of an element B" (or similar language) means that the element A is on the surface of the element B but does not necessarily mean that the element A covers the surface of the element B entirely. It will be also understood that "an element A conformally covers a surface of an element B" (or similar language) means that the element A is on the surface of the element B and has an uniform thickness along the surface of the element B.

Further, it will be understood that "an element A fills a space B" (or similar language) means that the element A partially or completely fills the space B but does not necessarily mean that the element A completely fills the space B.

Figure 1:
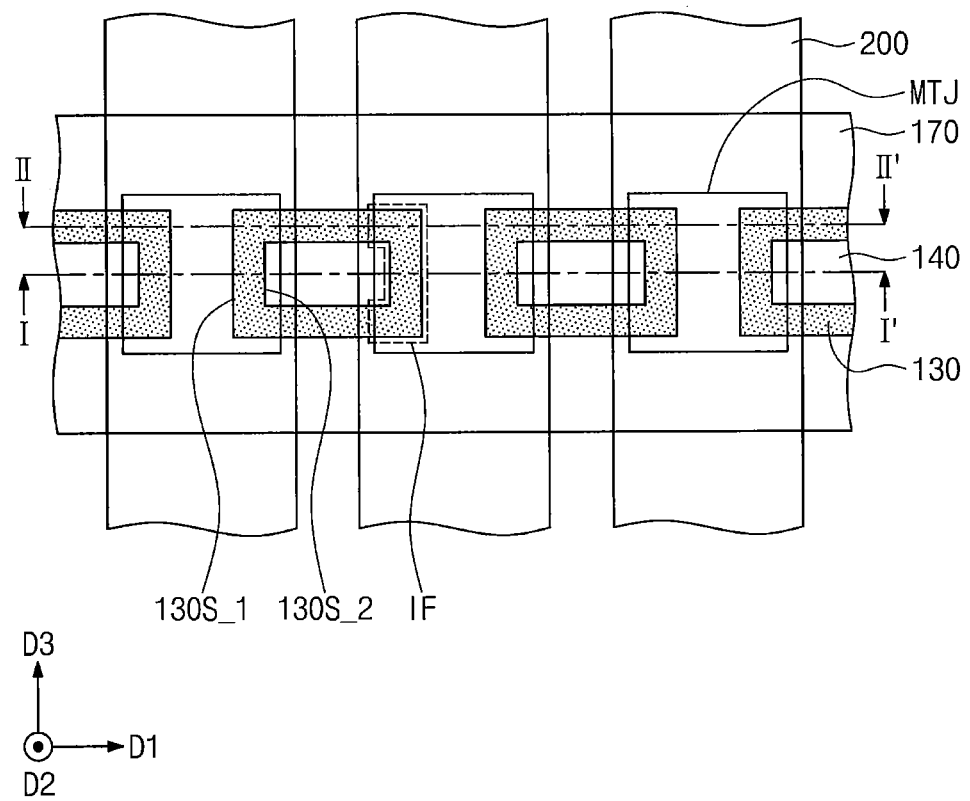
FIG. 1 is a plan view illustrating a magnetic memory device according to some embodiments of the present inventive concept.
Figure 2A:
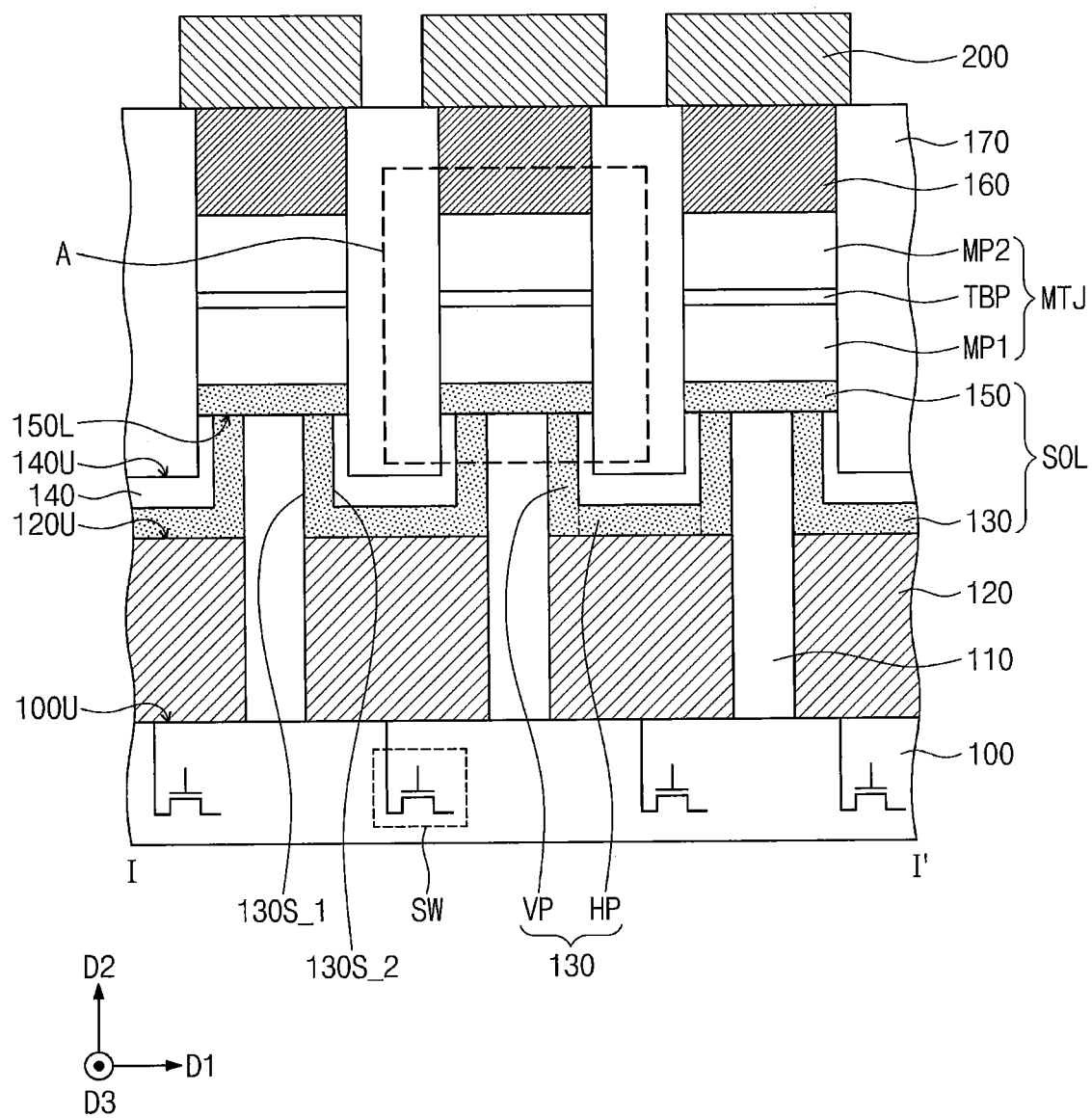
FIG. 2A is a cross-sectional view taken along the line I-I' of FIG. 1.
Figure 2B:
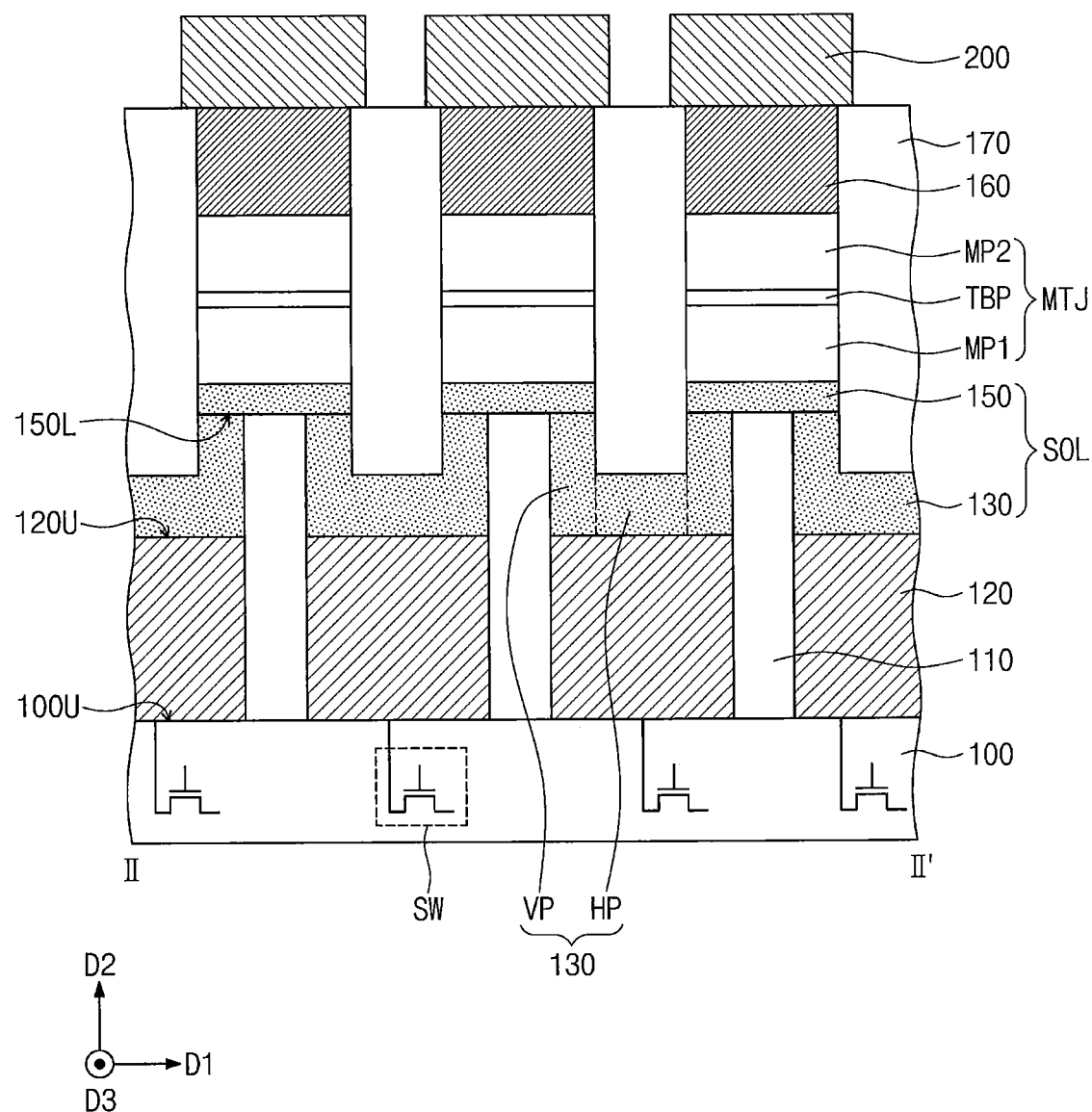
FIG. 2B is a cross-sectional view taken along the line II-II' of FIG. 1.
Figure 3:
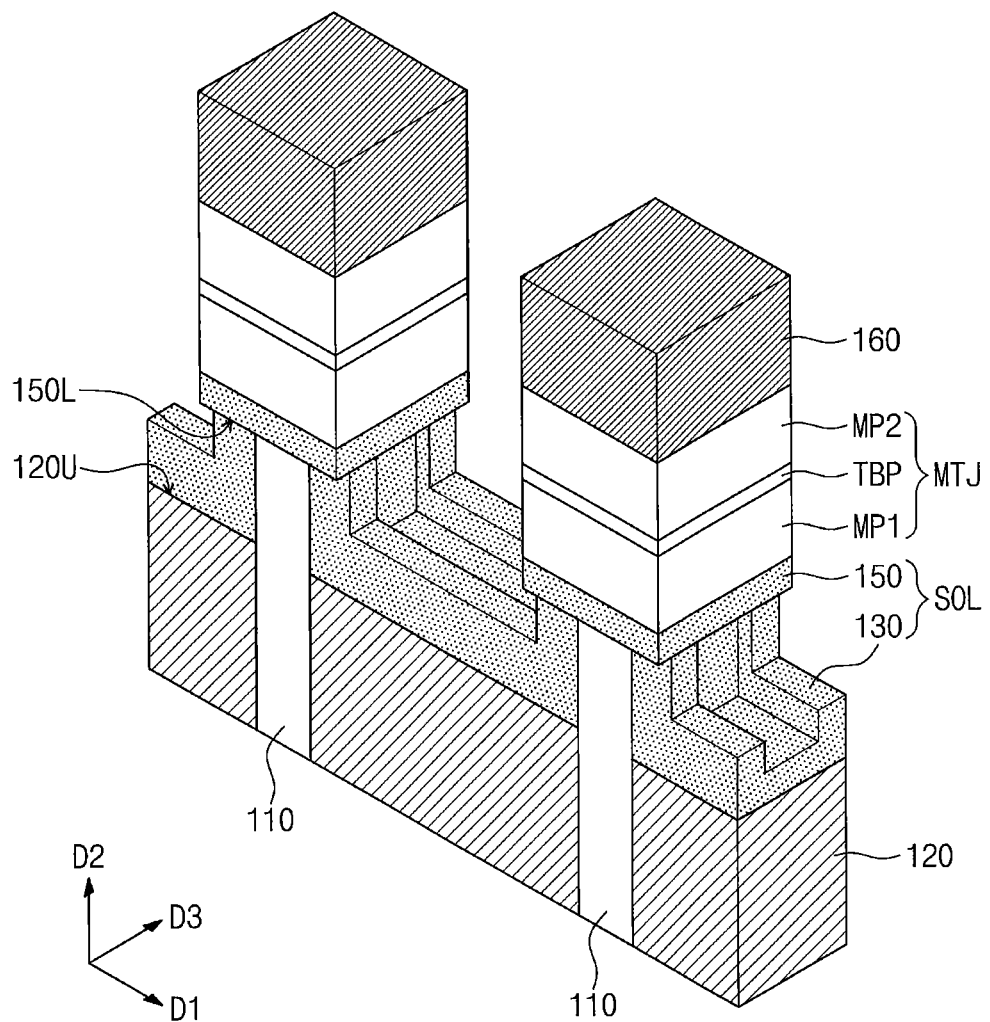
FIG. 3 is a perspective view of a portion of the magnetic memory device illustrated in FIG. 1 according to some embodiments of the present inventive concept.

FIG. 1 is a plan view illustrating a magnetic memory device according to some embodiments of the present inventive concept. FIG. 2A is a cross-sectional view taken along the line I-I' of FIG. 1, and FIG. 2B is a cross-sectional view taken along the line II-II' of FIG. 1. FIG. 3 is a perspective view of a portion of the magnetic memory device illustrated in FIG. 1 according to some embodiments of the present inventive concept.

Referring to FIGS. 1, 2A, 2B and 3, lower contact plugs 120 may be provided on a substrate 100, and a lower interlayered insulating layer 110 may be provided between the lower contact plugs 120. The substrate 100 may include a semiconductor substrate. In some embodiments, selection elements SW may be provided on the semiconductor substrate of the substrate 100. The semiconductor substrate of the substrate 100 may be formed of or include, for example, at least one of silicon (Si), silicon germanium (SiGe), germanium (Ge), or gallium arsenide (GaAs) or may include a silicon-on-insulator (SOI) wafer. The selection elements SW may be transistors (e.g., field effect transistors) or diodes.

The lower contact plugs 120 may be spaced apart from each other in a horizontal direction. In some embodiments, the lower contact plugs 120 may be spaced apart from each other in a first direction D1 (i.e., a first horizontal direction) that is parallel to a top surface 100U of the substrate 100. In some embodiments, each of the lower contact plugs 120 may be electrically coupled to (e.g., electrically connected to) a terminal of a corresponding one of the selection elements SW. The lower contact plugs 120 may be formed of or include, for example, at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

Two adjacent lower contact plugs 120 may be isolated (i.e. electrically disconnected or electrically insulated) from each other by a single lower interlayered insulating layer 110 between the two adjacent lower contact plugs 120. In some embodiments, a single lower interlayered insulating layer 110 may be interposed between two adjacent lower contact plugs 120 and may include a protruding portion that are located above top surfaces 120U of the two adjacent lower contact plugs 120 as illustrated in FIG. 2A. In some embodiments, the protruding portion of the lower interlayered insulating layer 110 may protrude beyond the top surfaces 120U of the two adjacent lower contact plugs 120 in a second direction D2 (i.e., a vertical direction), as illustrated in FIG. 2A, and the second direction D2 may be perpendicular to the top surface 100U of the substrate 100. The lower interlayered insulating layer 110 may be formed of or include, for example, at least one of oxide, nitride, and/or oxynitride.

Magnetic tunnel junction patterns MTJ may be provided on the lower interlayered insulating layer 110 and may be horizontally spaced apart from each other. Referring to FIG. 1, in some embodiments, the magnetic tunnel junction patterns MTJ may be arranged to be spaced apart from each other in the first direction D1. Each of the magnetic tunnel junction patterns MTJ may be provided on a corresponding one of the lower interlayered insulating layer 110, which is located between a corresponding pair of the lower contact plugs 120. Each pair of the lower contact plugs 120 may be provided at both sides of each of the magnetic tunnel junction patterns MTJ.

Each of the magnetic tunnel junction patterns MTJ may include a first magnetic pattern MP1, a tunnel barrier pattern TBP, and a second magnetic pattern MP2, which are sequentially stacked on the lower interlayered insulating layer 110 in the second direction D2. The tunnel barrier pattern TBP may be interposed between the first magnetic pattern MP1 and the second magnetic pattern MP2. The tunnel barrier pattern TBP may include at least one of, for example, magnesium oxide, titanium oxide, aluminum oxide, magnesium-zinc oxide, or magnesium-boron oxide. Each of the first and second magnetic patterns MP1 and MP2 may include at least one magnetic layer. In some embodiments, the first magnetic pattern MP1 may include a free layer, and the second magnetic pattern MP2 may include a pinned layer (i.e., a reference layer).

Electrode patterns 160 may be provided on the magnetic tunnel junction patterns MTJ, respectively. The first magnetic pattern MP1 may be provided between the lower interlayered insulating layer 110 and the tunnel barrier pattern TBP, and the second magnetic pattern MP2 may be provided between each of the electrode patterns 160 and the tunnel barrier pattern TBP. The electrode patterns 160 may include, for example, at least one of metals (e.g., Ta, W, Ru, and Ir) or conductive metal nitrides (e.g., TiN).

Referring to FIG. 2A, first conductive patterns 150 may be provided below the magnetic tunnel junction patterns MTJ, respectively. Each of the first conductive patterns 150 may be interposed between each of the magnetic tunnel junction patterns MTJ and the lower interlayered insulating layer 110. Second conductive patterns 130 may be provided on the lower contact plugs 120, respectively. The first and second conductive patterns 150 and 130 may be alternately arranged in the first direction D1. In some embodiments, a side of the first magnetic pattern MP1 (e.g., a side of a free layer of the first magnetic pattern MP1) and a side of the first conductive pattern 150 may be aligned and thus may form a straight side, as illustrated in FIG. 2A. The side of the first magnetic pattern MP1 and the side of the first conductive pattern 150 may be coplanar, as illustrated in FIG. 2A. Although, FIG. 2A shows that the straight side formed of the side of the first magnetic pattern MP1 and the side of the first conductive pattern 150 is not slanted with respect to the top surface 100U of the substrate 100 (e.g., forms a right angle with the top surface 100U of the substrate 100), it will be understood that the straight side can be slanted with respect to the top surface 100U of the substrate 100.

In some embodiments, two adjacent first conductive patterns 150 may be electrically connected to a single lower contact plug 120 through a single second conductive pattern 130, as illustrated in FIG. 2A. Therefore, the two adjacent first conductive patterns 150 may be electrically connected to a single selection element SW.

In some embodiments, two adjacent second conductive patterns 130 may be respectively connected to opposite end portions of each a single first conductive pattern 150. Each of the second conductive patterns 130 may be provided between the magnetic tunnel junction patterns MTJ, when viewed in a plan view and may connect (e.g., electrically connect) two adjacent first conductive patterns 150 each other. The first and second conductive patterns 150 and 130 arranged in the first direction D1 may be connected to each other, thereby constituting a single conductive line SOL.

The second conductive patterns 130 may be provided on the top surfaces 120U of the lower contact plugs 120, respectively. Each of the second conductive patterns 130 may have a ring shape, when viewed in a plan view and may be a hollow pipe structure extending from the top surface 120U of each of the lower contact plugs 120 in the second direction D2. In some embodiments, each of the second conductive patterns 130 may have a bottom-closed pipe shape. In this case, each of the second conductive patterns 130 may have a "U"-shape cross-section, when viewed in cross-section. An upper end of each of the second conductive patterns 130 may be connected to a bottom surface 150L of the first conductive pattern 150. As an example, the upper end of each of the second conductive patterns 130 may be in contact with the bottom surface 150L of the first conductive pattern 150, as illustrated in FIG. 2A. A lower end of each of the second conductive patterns 130 may be in contact with the top surface 120U of each of the lower contact plugs 120, as illustrated in FIG. 2A.

Each of the second conductive patterns 130 may include a vertical portion VP extending from the top surface 120U of each of the lower contact plugs 120 in the second direction D2. In some embodiments, the vertical portion VP may have a ring shape, when viewed in a plan view, as illustrated in FIG. 1. An upper end of the vertical portion VP of each of the second conductive patterns 130 may be connected to the bottom surfaces 150L of the first conductive patterns 150. As an example, the upper end of the vertical portion VP of each of the second conductive patterns 130 may be in contact with the bottom surfaces 150L of the first conductive patterns 150. A lower end of the vertical portion VP of each of the second conductive patterns 130 may be in contact with the top surface 120U of each of the lower contact plugs 120. The magnetic tunnel junction pattern MTJ may at least partially overlap vertical portions VP of a pair of the second conductive patterns 130, as illustrated in FIGS. 1 and 2A.

Referring to FIG. 2A, in some embodiments, the vertical portion VP of the second conductive pattern 130 may contact the bottom surface 150L of the first conductive pattern 150 and may protrude from away from the first conductive pattern 150 in the second direction D2 toward the lower contact plug 120. The vertical portions VP of the second conductive patterns 130 may be spaced apart from each other in the first direction D1. It will be understood that a first conductive pattern 150 can be considered as a horizontal portion of a single conductive line SOL, and vertical portions VP of a second conductive pattern 130 can be considered as protruding portions of the single conductive line SOL.

In some embodiments, each of the second conductive patterns 130 may further include a horizontal portion HP extending from the vertical portion VP in a direction parallel to the top surface 100U of the substrate 100. The horizontal portion HP may extend along the top surface 120U of each of the lower contact plugs 120. In some embodiments, the horizontal portion HP of each of the second conductive patterns 130 may extend in the first direction D1 and a third direction D3 crossing the first direction D1, as illustrated in FIG. 1. The third direction D3 may be parallel to the top surface 100U of the substrate 100. In some embodiments, the third direction D3 may be perpendicular to the first direction D1. The horizontal portion HP of each of the second conductive patterns 130 may be in contact with the top surface 120U of each of the lower contact plugs 120.

The lower interlayered insulating layer 110 may be extended into a region between the second conductive patterns 130. The lower interlayered insulating layer 110 may be interposed between two adjacent second conductive patterns 130 and may be in contact with the bottom surfaces 150L of the first conductive patterns 150.

Still referring to FIG. 2A, insulating patterns 140 may be provided on the top surfaces 120U of the lower contact plugs 120, respectively. Each of the insulating patterns 140 may be provided to fill an internal space of a corresponding one of the second conductive patterns 130. The vertical portion VP of each of the second conductive patterns 130 may be interposed between each of the insulating patterns 140 and the lower interlayered insulating layer 110. In some embodiments, each of the second conductive patterns 130 may include a portion that is horizontally extended and is interposed between each of the insulating patterns 140 and the top surface 120U of each of the lower contact plugs 120. As an example, the horizontal portion HP of each of the second conductive patterns 130 may be interposed between each of the insulating patterns 140 and the top surface 120U of each of the lower contact plugs 120. A top surface 140U of each of the insulating patterns 140 may be recessed toward the substrate 100. The insulating patterns 140 may be formed of or include, for example, at least one of oxide, nitride, and/or oxynitride. For example, the insulating patterns 140 may include silicon oxide and/or silicon nitride.

Referring to FIGS. 1 and 2A, the vertical portion VP of the second conductive pattern 130 may include a first surface 130S_1 contacting the lower interlayered insulating layer 110 and a second surface 130S_2 opposite the first surface 130S_1, and the second surface 130S_2 of the vertical portion VP of the second conductive pattern 130 may be recessed toward the lower interlayered insulating layer 110 in the first direction D1. The second surface 130S_2 of the vertical portion VP of the second conductive pattern 130 may be recessed toward the lower interlayered insulating layer 110 with respect to the side of the first conductive pattern 150.

An upper interlayered insulating layer 170 may be provided on the lower interlayered insulating layer 110 to cover the magnetic tunnel junction patterns MTJ and the electrode patterns 160. The upper interlayered insulating layer 170 may cover side surfaces of the magnetic tunnel junction patterns MTJ and the electrode patterns 160 and may cover the recessed top surface 140U of each of the insulating patterns 140. The upper interlayered insulating layer 170 may be formed of or include, for example, at least one of oxide, nitride, and/or oxynitride.

Referring to FIG. 2A, upper conductive lines 200 may be provided on the upper interlayered insulating layer 170. The upper conductive lines 200 may be connected to the magnetic tunnel junction patterns MTJ, respectively. Each of the upper conductive lines 200 may be electrically connected to a corresponding one of the magnetic tunnel junction patters MTJ through a corresponding one of the electrode patterns 160. In some embodiments, the upper conductive lines 200 may be extended in (e.g., extended longitudinally in) the third direction D3 and may be spaced apart from each other in the first direction D1. The upper conductive lines 200 may include, for example, at least one of metals (e.g., copper) or conductive metal nitrides. The upper conductive lines 200 may be used as bit lines of the magnetic memory device.

Referring to FIGS. 2B and 3, a side of the vertical portion VP of the second conductive pattern 130 may be aligned with both a side of the first magnetic pattern MP1 and a side of the first conductive pattern 150, and the side of the vertical portion VP of the second conductive pattern 130, the side of the first magnetic pattern MP1, and the side of the first conductive pattern 150 may form a straight side. Although, FIG. 2B shows that the straight side formed of the side of the vertical portion VP of the second conductive pattern 130, the side of the first magnetic pattern MP1, and the side of the first conductive pattern 150 is not slanted with respect to the top surface 100U of the substrate 100, it will be understood that the straight side can be slanted with respect to the top surface 100U of the substrate 100.

Figure 4:
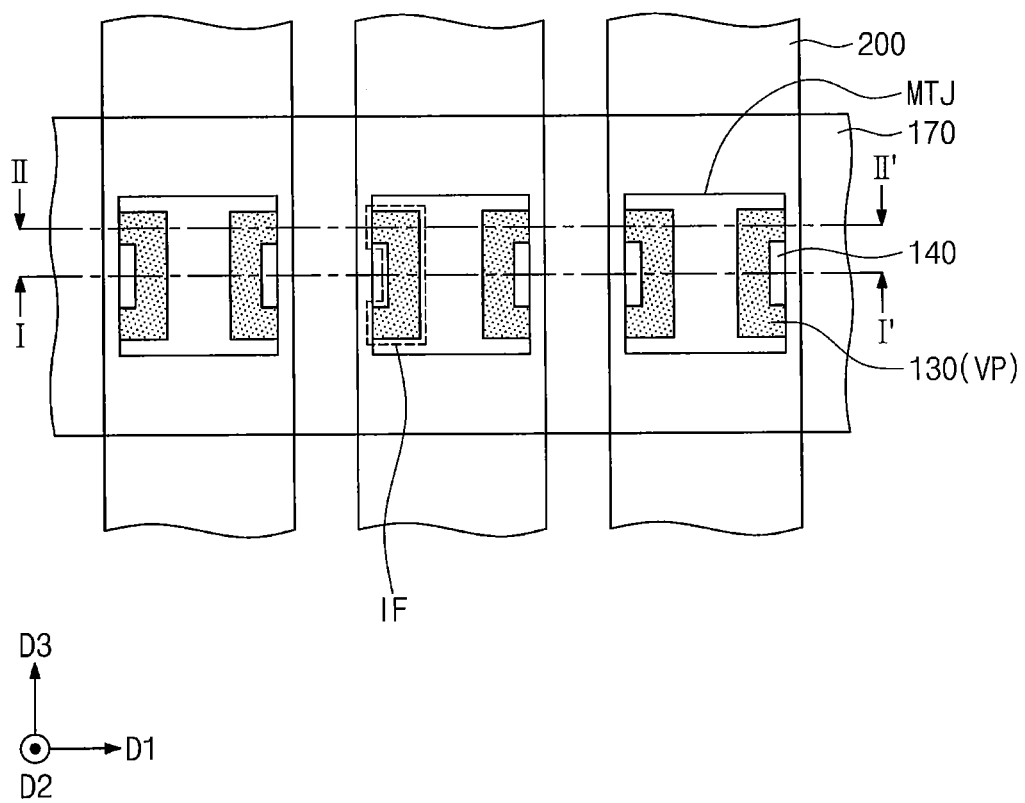
FIG. 4 is a plan view illustrating a magnetic memory device according to some embodiments of the present inventive concept.
Figure 5A:
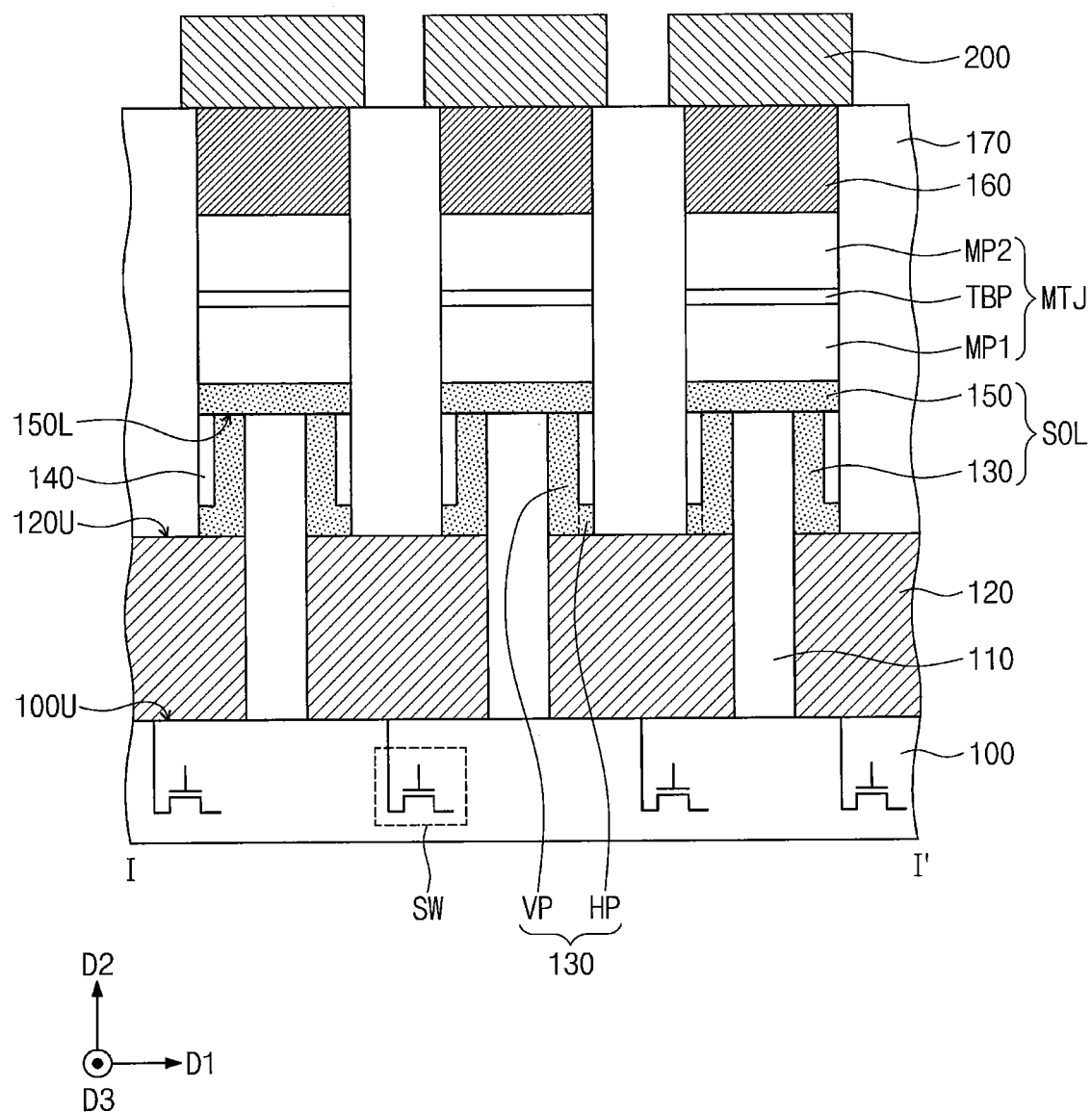
FIG. 5A is a cross-sectional view taken along the line of FIG. 4.
Figure 5B:
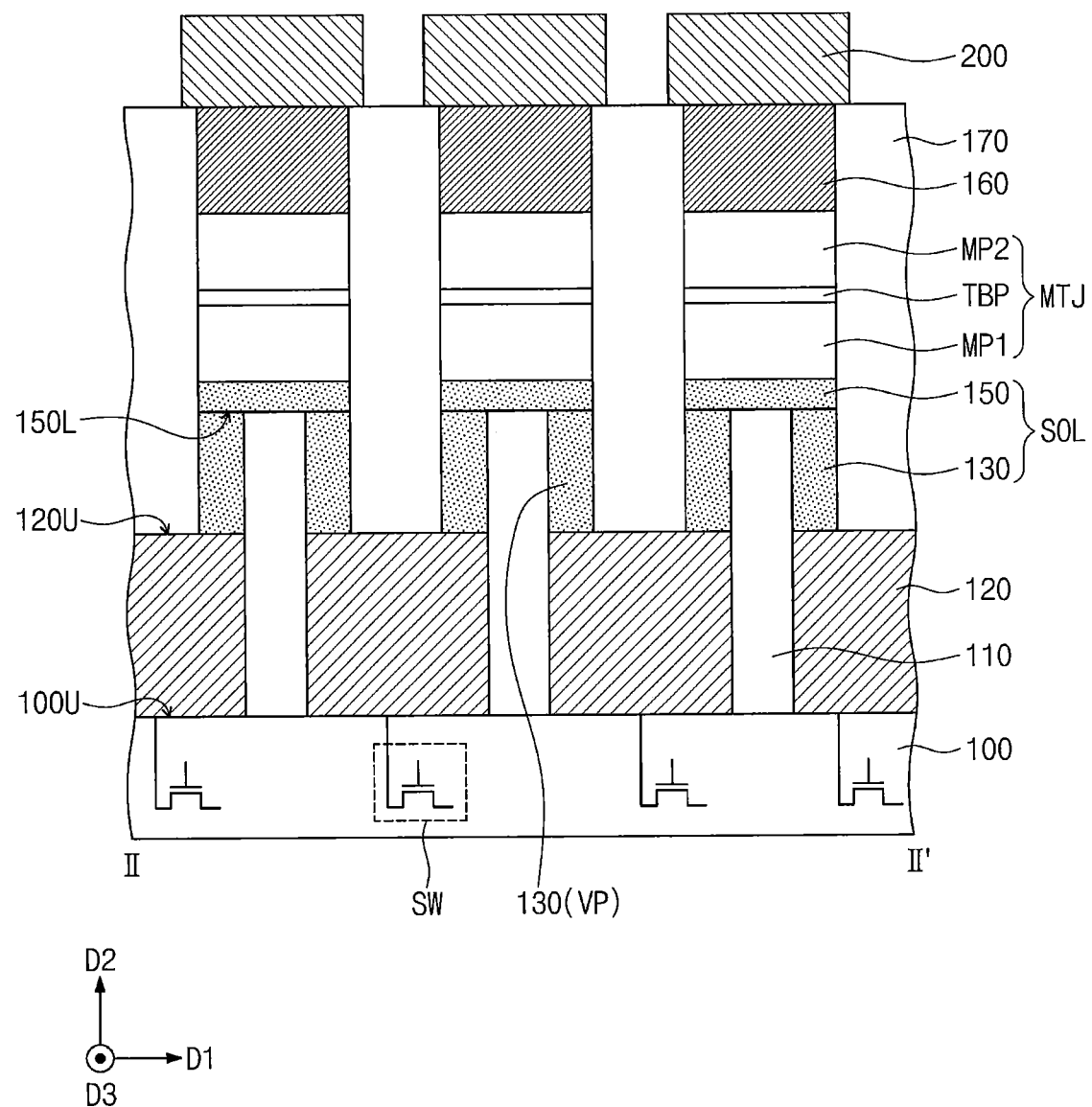
FIG. 5B is a cross-sectional view taken along the line II-II' of FIG. 4.

FIG. 4 is a plan view illustrating a magnetic memory device according to some embodiments of the present inventive concept. FIG. 5A is a cross-sectional view taken along the line I-I' of FIG. 4, and FIG. 5B is a cross-sectional view taken along the line II-II' of FIG. 4. Referring to FIGS. 4, 5A, and 5B, horizontal portions HP of the second conductive pattern 130 on a single lower contact plug 120 may be spaced apart from each other in the first direction D1 and may expose a top surface 120U of the lower contact plug 120.

A magnetic tunnel junction patterns MTJ may overlap an interface IF between a first conductive pattern 150 and a vertical portion VP of a second conductive pattern 130. In some embodiments, a magnetic tunnel junction patterns MTJ may overlap an entirety of an interface IF between a first conductive pattern 150 and a vertical portion VP of a second conductive pattern 130, as illustrated in FIGS. 1 and 4.

Figure 6:
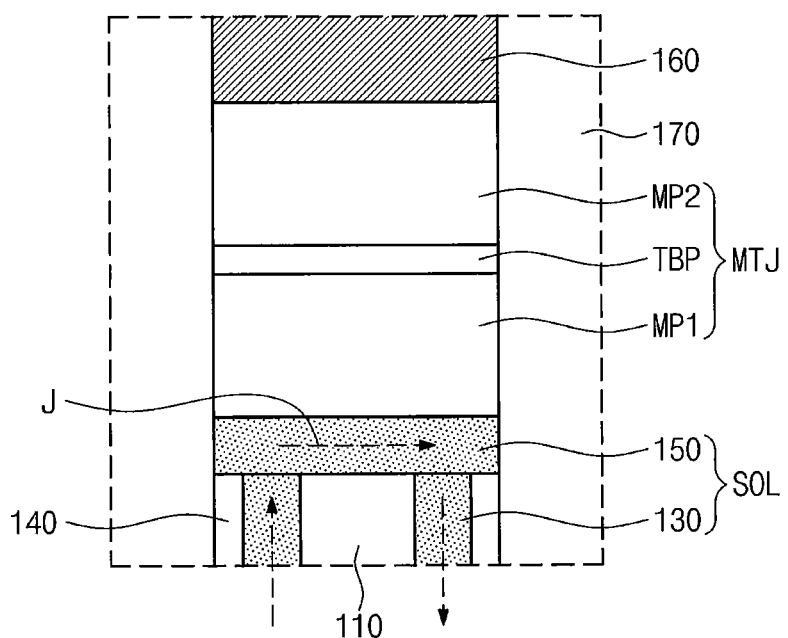
FIG. 6 is an enlarged cross-sectional view of the portion 'A' of FIG. 2A, which is provided to describe an example of a conductive line SOL.

FIG. 6 is an enlarged cross-sectional view of the portion 'A' of FIG. 2A, which is provided to describe an example of the conductive line SOL.

Referring to FIGS. 2A and 6, the first conductive patterns 150 may be configured to exert a spin-orbit torque on the magnetic tunnel junction patterns MTJ, respectively. As an example, a current J may flow through the conductive line SOL including the first and second conductive patterns 150 and 130. The current J may be an in-plane current flowing through the first conductive patterns 150. The first conductive patterns 150 may be configured to exhibit a strong spin-orbit interaction. Due to the spin-orbit interaction in the first conductive patterns 150, the current J flowing through the first conductive patterns 150 may lead to an accumulation of spin-polarized charge carriers (e.g., electrons) near the magnetic tunnel junction patterns MTJ. The accumulated charge carriers may produce a spin-orbit field. The spin-orbit field may be parallel to a top or bottom surface of the first conductive pattern 150 such that may have an in-plane direction and may be perpendicular to a direction of the in-plane current J flowing through the first conductive patterns 150. For example, the in-plane current J in the first conductive patterns 150 may flow in the first direction D1, and the spin-orbit field may be parallel to the third direction D3. The spin-orbit field produced in the first conductive patterns 150 may be used to exert the spin-orbit torque on the magnetic tunnel junction patterns MTJ. Each of the magnetic tunnel junction patterns MTJ may be configured in such a way that magnetization of a free layer thereof can be switched using the spin-orbit torque.

In some embodiments, the first conductive patterns 150 may be formed of or include, for example, a heavy metal or a material including (e.g., being doped with) a heavy metal. As an example, the first conductive patterns 150 may include at least one of "A" elements or "M" elements doped with "B" element. Here, the "A" elements may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta) (including high-resistive amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or combinations thereof.

The "B" element may include at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb).

The "M" elements may include at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt) gold (Au), mercury (Hg), lead (Pb), silicon (Si), gallium (Ga), gallium manganese (GaMn), or gallium arsenide (GaAs). As an example, the first conductive patterns 150 may include iridium-doped copper and/or bismuth-doped copper.

In some embodiments, the second conductive patterns 130 may include substantially the same material as the first conductive patterns 150. In some embodiments, the second conductive patterns 130 may include a conductive material different from that of the first conductive patterns 150. In some embodiments, each of the second conductive patterns 130 may be a non-magnetic layer.

Figure 7:
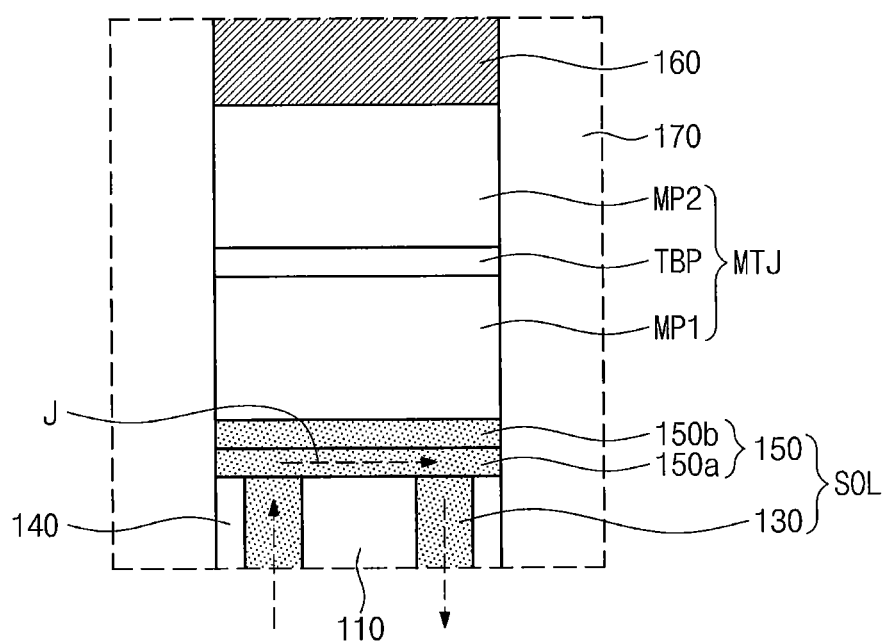
FIG. 7 is an enlarged cross-sectional view of the portion 'A' of FIG. 2A, which is provided to describe an example of the conductive line SOL.

FIG. 7 is an enlarged cross-sectional view of the portion 'A' of FIG. 2A, which is provided to describe an example of the conductive line SOL.

Referring to FIGS. 2A and 7, each of the first conductive patterns 150 according to some embodiments of the present inventive concept may have a multi-layered structure. Each of the first conductive patterns 150 may include a lower pattern 150a, which is interposed between each of the magnetic tunnel junction patterns MTJ and the lower interlayered insulating layer 110, and an upper pattern 150b, which is interposed between each of the magnetic tunnel junction patterns MTJ and the lower pattern 150a. As an example, the lower pattern 150a may be a magnetic layer, and the upper pattern 150b may be a non-magnetic layer.

The first conductive patterns 150 may be configured to exert a spin-orbit torque on the magnetic tunnel junction patterns MTJ. A current J may flow through the conductive line SOL including the first and second conductive patterns 150 and 130. The current J may be an in-plane current flowing through the first conductive patterns 150. In some embodiments, the lower pattern 150a may include a magnetic layer and may have a magnetic moment polarized in a specific direction. The direction of the magnetic moment may be parallel to a top surface of the lower pattern 150a (i.e. may be in plane of the lower pattern 150a), may be perpendicular to the top surface of the lower pattern 150a (i.e. may be perpendicular to the plane of the lower pattern 150a), or may be inclined to a direction normal to the top surface of the lower pattern 150a (i.e. may be inclined to a direction perpendicular to the plane of the lower pattern 150a). The direction of the magnetic moment of the lower pattern 150a may be selected depending on a direction of an easy axis of a free layer in each of the magnetic tunnel junction patterns MTJ.

A part of the in-plane current J flowing through the first conductive patterns 150 may be spin-polarized by the lower pattern 150a. As an example, charge carriers (e.g., electrons) in the lower pattern 150a may be spin-polarized depending on the direction of the magnetic moment of the lower pattern 150a. The charge carriers (e.g., electrons) in the lower pattern 150a may be spin-polarized to be along the direction of the magnetic moment of the lower pattern 150a. The spin-polarized charge carriers may flow from the lower pattern 150a to the upper pattern 150b and may be accumulated in the upper pattern 150b (e.g., a non-magnetic layer) near the magnetic tunnel junction patterns MTJ. Due to the accumulation of the spin-polarized charge carriers, the spin-orbit torque may be exerted on the magnetic tunnel junction patterns MTJ. Each of the magnetic tunnel junction patterns MTJ may be configured in such a way that magnetization of the free layer thereof can be switched using the spin-orbit torque.

The lower pattern 150a may include, for example, at least one of iron (Fe), cobalt (Co), or nickel (Ni) and may further include at least one of platinum (Pt), palladium (Pd), manganese (Mn), yttrium (Y), chromium (Cr), ruthenium (Ru), rhodium (Rh), tungsten (W), tantalum (Ta), boron (B), bismuth (Bi), iridium (Ir), lead (Pb), nitrogen (N), or oxygen (O). The upper pattern 150b may include, for example, at least one of copper (Cu), silver (Ag), gold (Au), tantalum (Ta), tungsten (W), or nitrogen (N). The present inventive concept is not limited to the above-enumerated materials for the lower pattern 150a and the upper pattern 150b and may include various materials.

In some embodiments, the second conductive patterns 130 may include a conductive material different from that of the first conductive patterns 150. In some embodiments, the second conductive patterns 130 may have the same multi-layered structure as the first conductive patterns 150 and may include the same material as the first conductive patterns 150.

Figure 8:
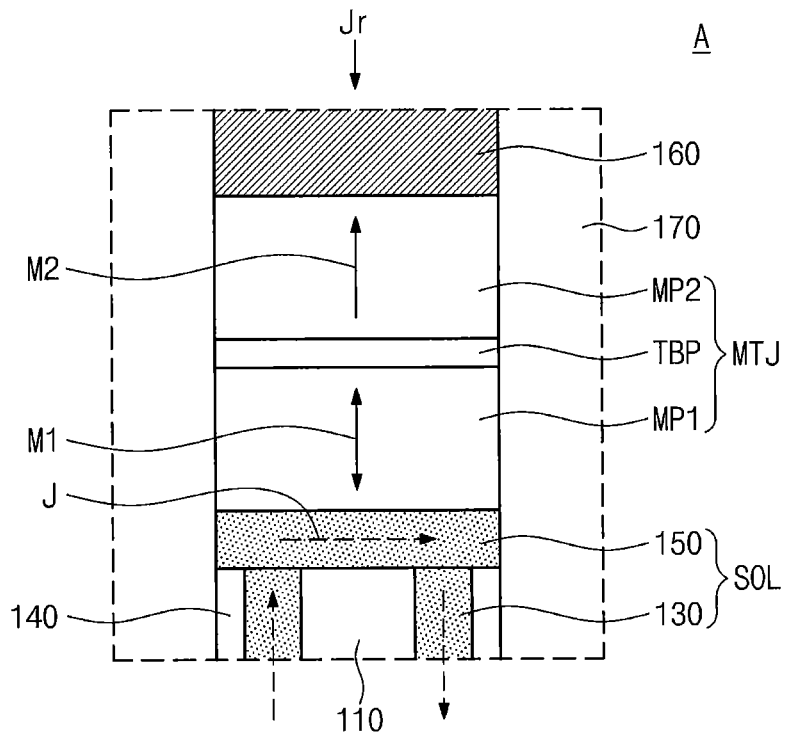
FIG. 8 is an enlarged cross-sectional view of the portion 'A' of FIG. 2A, which is provided to describe an example of a magnetic tunnel junction pattern MTJ.
Figure 9:
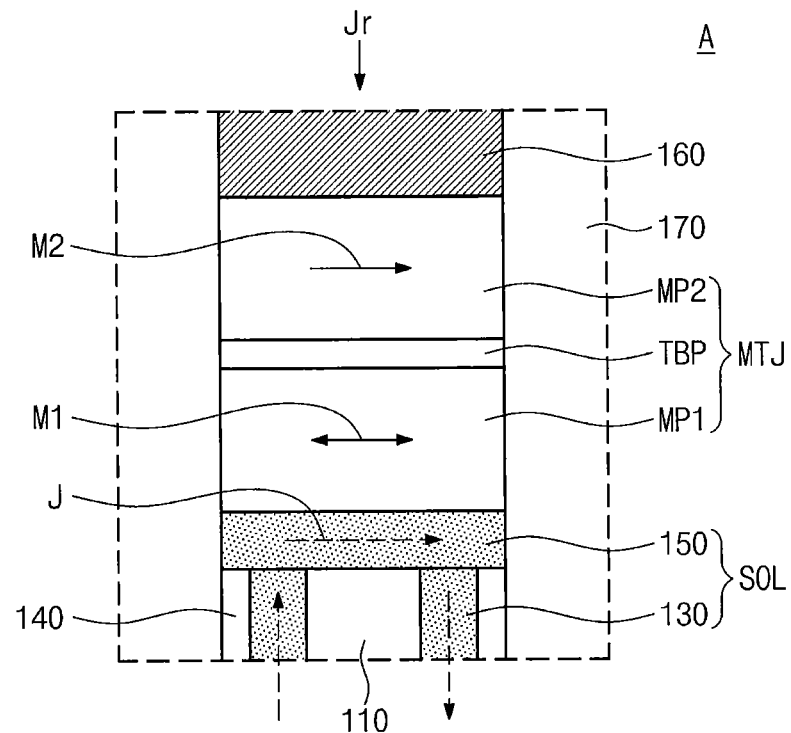
FIG. 9 is an enlarged cross-sectional view of the portion 'A' of FIG. 2A, which is provided to describe an example of the magnetic tunnel junction pattern MTJ.

FIG. 8 is an enlarged cross-sectional view of the portion 'A' of FIG. 2A, which is provided to describe an example of a magnetic tunnel junction pattern MTJ, and FIG. 9 is an enlarged cross-sectional view of the portion 'A' of FIG. 2A, which is provided to describe an example of the magnetic tunnel junction pattern MTJ.

Referring to FIGS. 8 and 9, the first magnetic pattern MP1 may be provided between each of the first conductive patterns 150 and the tunnel barrier pattern TBP, and the second magnetic pattern MP2 may be provided between each of the electrode patterns 160 and the tunnel barrier pattern TBP. The second magnetic pattern MP2 may include a reference layer (i.e. a pinned layer) whose magnetization direction M2 is fixed in a specific direction, and the first magnetic pattern MP1 may include a free layer whose magnetization direction M1 can be switched to be parallel or antiparallel to the magnetization direction M2 of the reference layer. FIGS. 8 and 9 illustrate an example in which the first magnetic pattern MP1 includes the free layer and the second magnetic pattern MP2 includes the reference layer, but the present inventive concept is not limited thereto. In some embodiments, unlike that shown in FIGS. 8 and 9, the first magnetic pattern MP1 may include the reference layer, and the second magnetic pattern MP2 may include the free layer.

As an example, as shown in FIG. 8, the magnetization directions M1 and M2 may be substantially perpendicular to an interface between the tunnel barrier pattern TBP and the first magnetic pattern MP1. In this case, each of the reference layer and the free layer may include, for example, at least one of perpendicular magnetic materials (e.g., CoFeTb, CoFeGd, and CoFeDy), perpendicular magnetic materials with $L1_0$ structure, CoPt-based materials with hexagonal-close-packed structure, or perpendicular magnetic structures. The perpendicular magnetic material with the $L1_0$ structure may include, for example, at least one of $L1_0$ FePt, $L1_0$ FePd, $L1_0$ CoPd, or $L1_0$ CoPt. The perpendicular magnetic structures may include magnetic layers and non-magnetic layers that are alternately and repeatedly stacked. For example, the perpendicular magnetic structures may include, for example, at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, and n denotes the number of stacking. In some embodiments, the reference layer may be thicker than the free layer or may be configured to have a coercive force greater than that of the free layer.

The magnetization directions M1 and M2 may be substantially parallel to an interface between the tunnel barrier pattern TBP and the first magnetic pattern MP1 as shown in FIG. 9. In this case, each of the reference layer and the free layer may include a ferromagnetic material. In some embodiments, the reference layer may further include an antiferromagnetic material, which may be used to fix a magnetization direction of the ferromagnetic material.

As described with reference to FIGS. 2A, 6, and 7, the first conductive patterns 150 may be configured to exert the spin-orbit torque on the magnetic tunnel junction patterns MTJ. Magnetization of the free layer of each of the magnetic tunnel junction patterns MTJ may be switched using the spin-orbit torque. In some embodiments, a switching operation (i.e., a write operation) on the magnetic tunnel junction patterns MTJ may be performed based on the spin-orbit torque. A reading operation on the magnetic tunnel junction patterns MTJ may be performed by a method similar to that in a spin-transfer-torque memory (e.g., a spin-transfer-torque MRAM). As an example, a read current Jr may flow through each of the magnetic tunnel junction patterns MTJ and each of the upper conductive lines 200 of FIG. 2A in the vertical or second direction D2. A resistance state of the magnetic tunnel junction patterns MTJ may be determined by sensing the read current Jr. For example, the read current Jr may be sensed to determine whether the magnetic tunnel junction patterns MTJ is in a high resistance state or in a low resistance state.

FIGS. 10A to 14A are plan views illustrating a method of fabricating a magnetic memory device, according to some embodiments of the present inventive concept. FIGS. 10B to 14B are cross-sectional views taken along the lines I-I' of FIGS. 10A to 14A, respectively. In the following description, elements described with reference to FIGS. 1 to 9 will be identified by the same reference numbers without repeating description thereof for the sake of brevity. For convenience in illustration, the selection elements SW are not illustrated in FIGS. 10B to 14B.

Figure 10A:
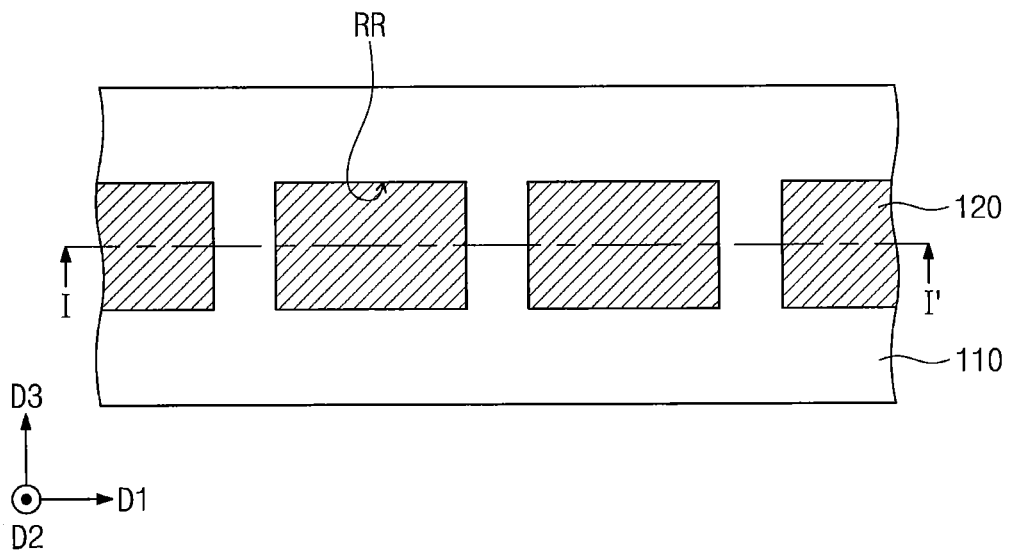
Figure 10B:
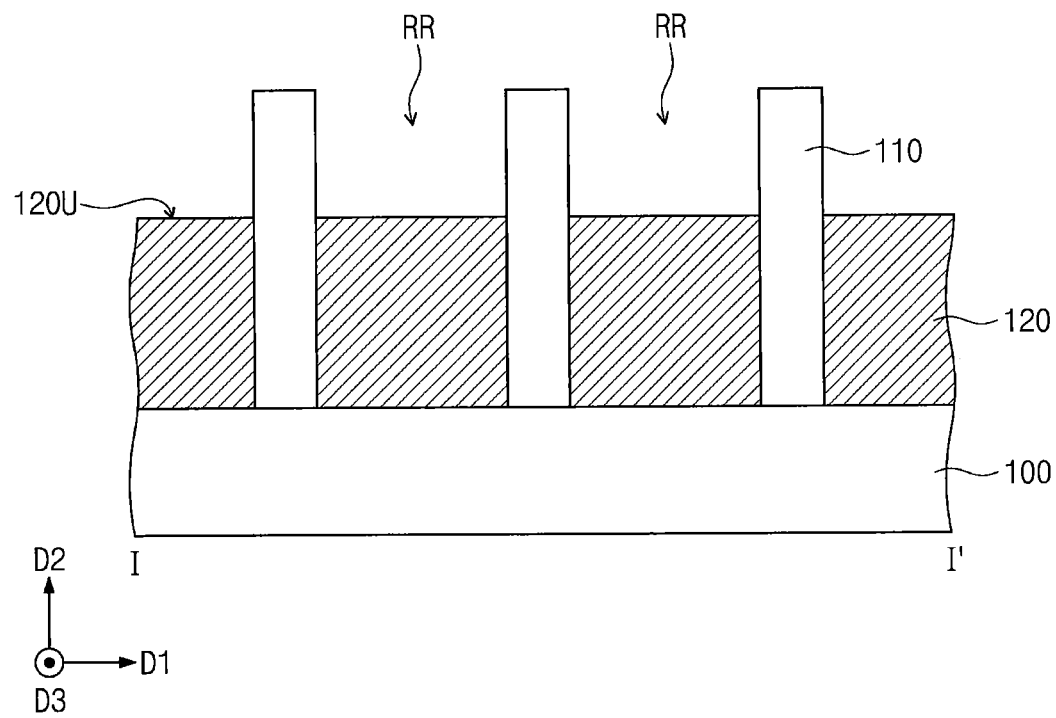

Referring to FIGS. 10A and 10B, the lower interlayered insulating layer 110 may be formed on the substrate 100. The substrate 100 may include a semiconductor substrate, and, in some embodiments, the substrate 100 may further include selection elements (e.g., SW of FIG. 2A), which are formed on the semiconductor substrate. The lower contact plugs 120 may be formed in the lower interlayered insulating layer 110. In some embodiments, the formation of the lower contact plugs 120 may include forming lower contact holes to penetrate the lower interlayered insulating layer 110 and forming the lower contact plugs 120 in the lower contact holes, respectively. In some embodiments, each of the lower contact plugs 120 may be connected to a terminal of a corresponding one of the selection elements SW. In some embodiments, recess regions RR may be formed in the lower interlayered insulating layer 110 by recessing upper portions of the lower contact plugs 120. Each of the recess regions RR may be formed to expose an inner surface (e.g., a side) of the lower interlayered insulating layer 110 and the top surface 120U of each of the lower contact plugs 120. In some embodiments, the formation of the recess regions RR may include forming an interlayered insulating layer (not shown) on the lower interlayered insulating layer 110 to cover the lower contact plugs 120 and patterning the interlayered insulating layer to form the recess regions RR in the interlayered insulating layer. In this case, each of the recess regions RR may be formed to penetrate the interlayered insulating layer and to expose the top surface 120U of each of the lower contact plugs 120.

Figure 11A:
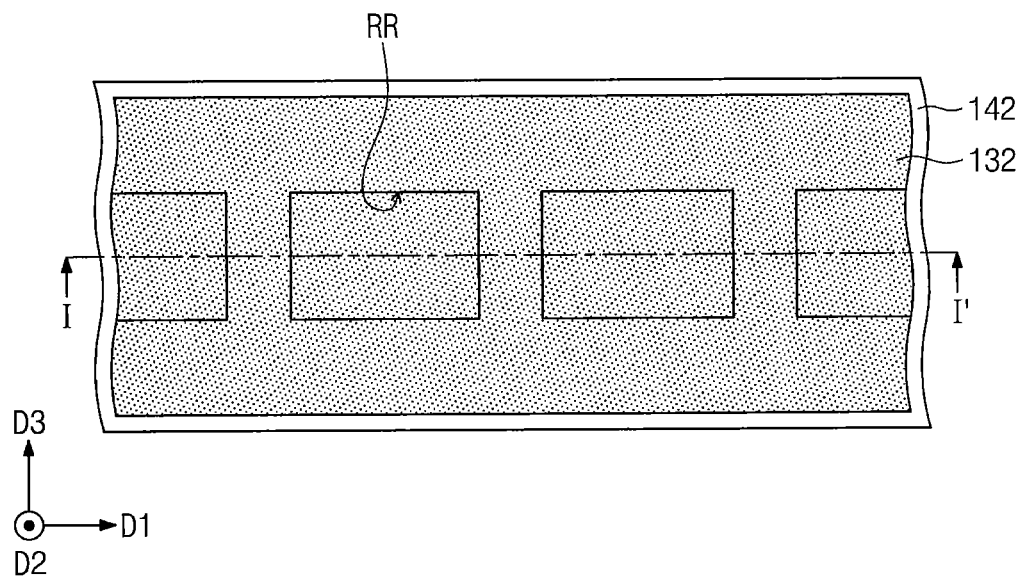
Figure 11B:
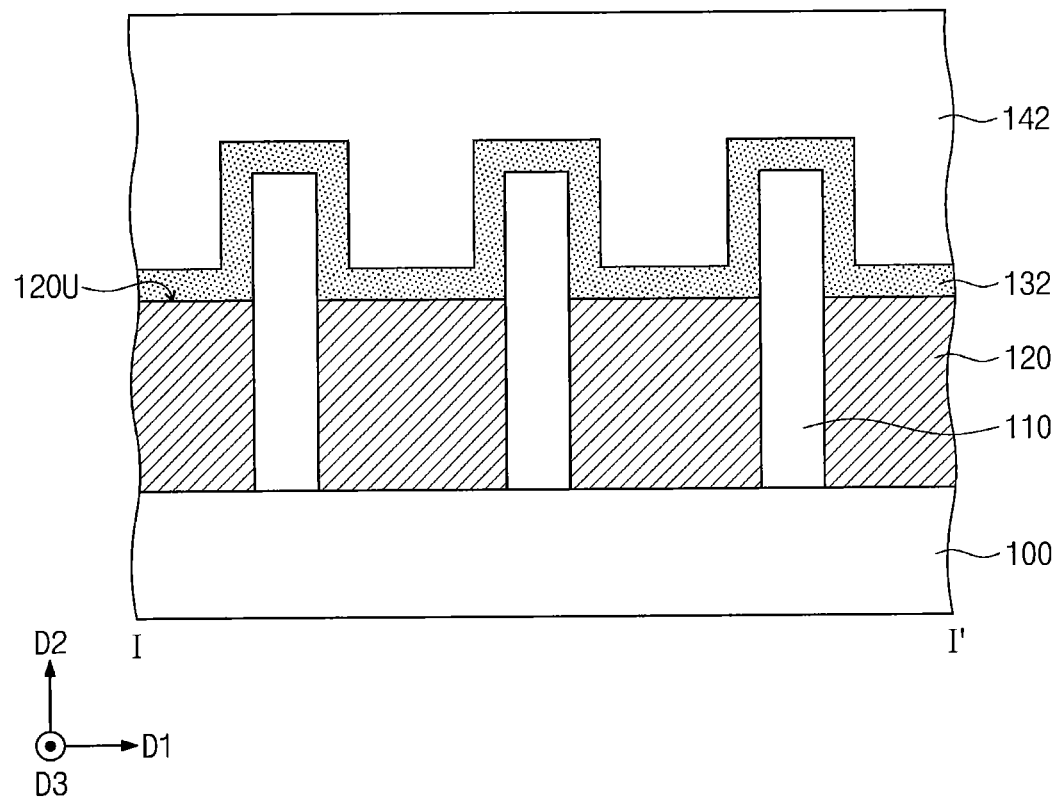

Referring to FIGS. 11A and 11B, a second conductive layer 132 may be formed on the lower interlayered insulating layer 110 to partially fill each of the recess regions RR. For example, the second conductive layer 132 may be formed to conformally cover inner surfaces of the recess regions RR, as illustrated in FIG. 11B. The second conductive layer 132 may cover the inner surface of the lower interlayered insulating layer 110 and the top surface 120U of each of the lower contact plugs 120, which is exposed by each of the recess regions RR, with a uniform thickness and may be extended to cover a top surface of the lower interlayered insulating layer 110. An insulating layer 142 may be formed on the second conductive layer 132 to fill a remaining empty space of each of the recess regions RR. The second conductive layer 132 and the insulating layer 142 may be formed by, for example, a sputtering process, a chemical vapor deposition process, or an atomic layer deposition process.

Figure 12A:
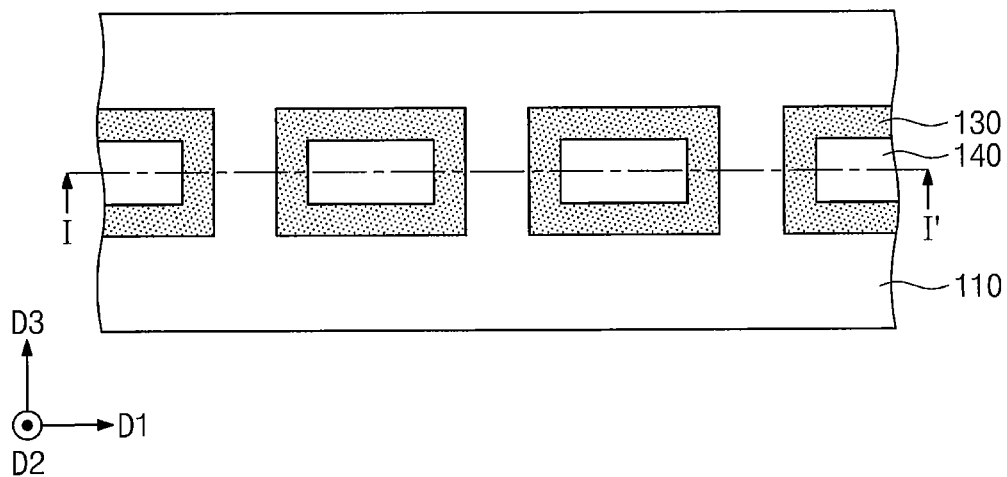
Figure 12B:
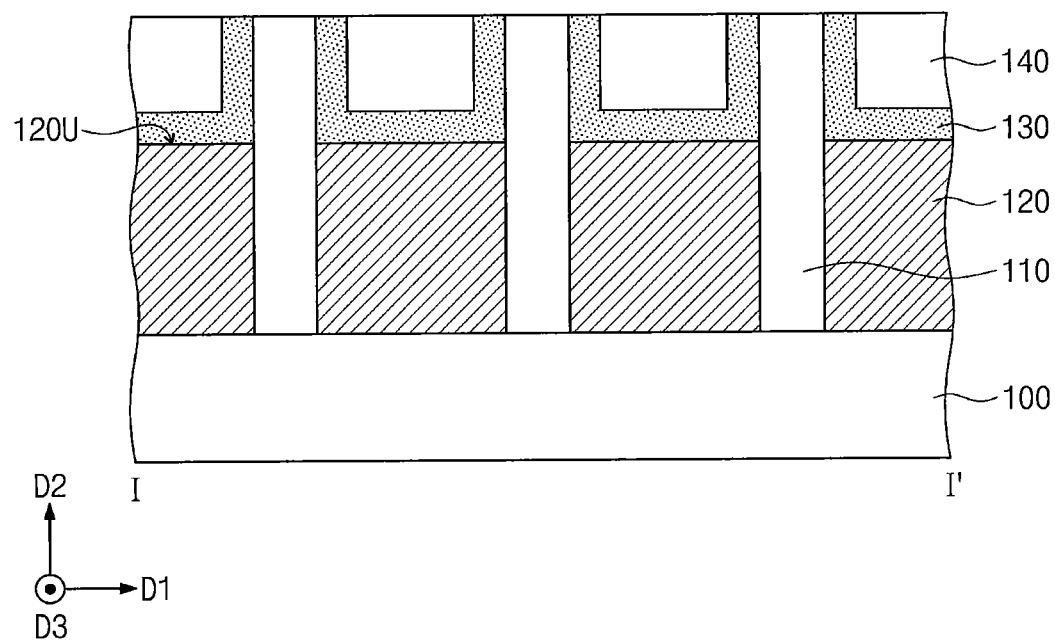

Referring to FIGS. 12A and 12B, a planarization process may be performed on the second conductive layer 132 and the insulating layer 142. In some embodiments, the planarization process may be performed to expose the top surface of the lower interlayered insulating layer 110. As a result of the planarization process, the second conductive layer 132 may be divided into the second conductive patterns 130, and the insulating layer 142 may be divided into the insulating patterns 140. Each of the second conductive patterns 130 and each of the insulating patterns 140 may be formed in each of the recess regions RR and may be sequentially stacked on the top surface 120U of each of the lower contact plugs 120.

As described with reference to FIGS. 1 to 3, each of the second conductive patterns 130 may have a ring shape, when viewed in a plan view, and, in some embodiments, each of the second conductive patterns 130 may have a hollow pipe structure extending from the top surface 120U of each of the lower contact plugs 120 in the second direction D2. In some embodiments, each of the second conductive patterns 130 may be formed to have a bottom-closed pipe shape. Each of the second conductive patterns 130 may have a "U"-shape cross-section, when viewed in in cross-section. Each of the insulating patterns 140 may be formed to fill an internal space of a corresponding one of the second conductive patterns 130. In some embodiments, each of the insulating patterns 140 may be formed to fill a space defined by a corresponding one of the second conductive patterns 130. In some embodiments, a portion of the second conductive layer 132 may remain on the top surface of the lower interlayered insulating layer 110, after the planarization process, unlike that illustrated in FIG. 12B.

Figure 13A:
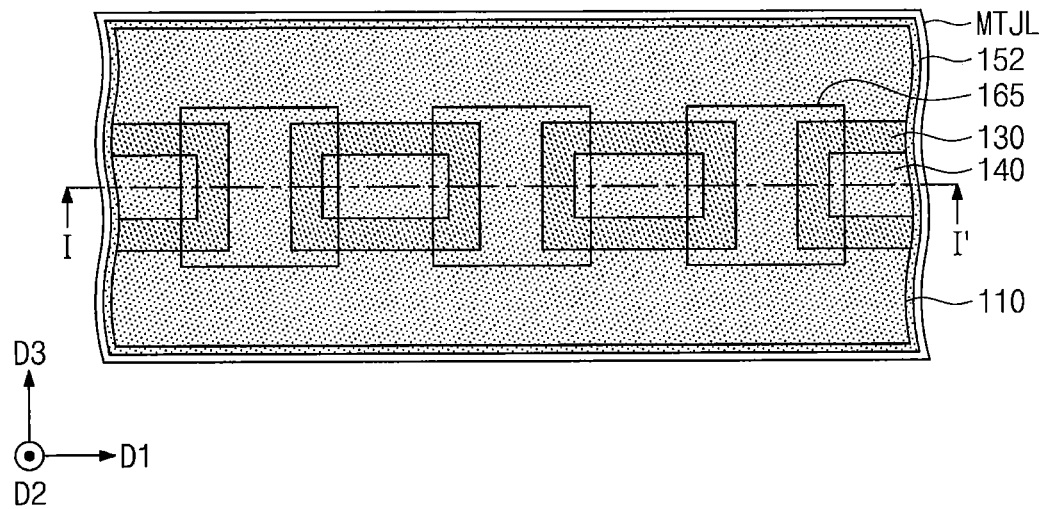
Figure 13B:
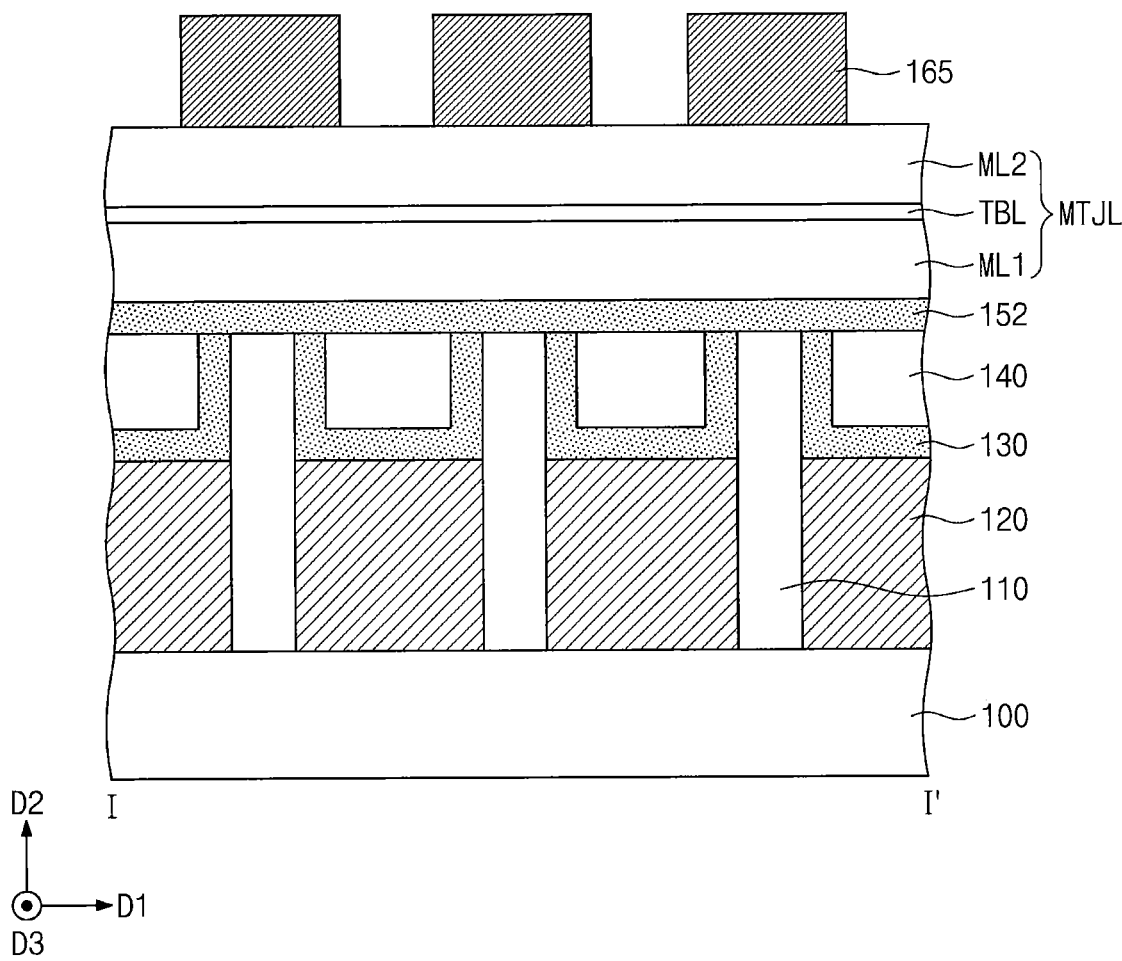

Referring to FIGS. 13A and 13B, a first conductive layer 152 and a magnetic tunnel junction layer MTJL may be sequentially formed on the lower interlayered insulating layer 110. The first conductive layer 152 may be formed to cover the lower interlayered insulating layer 110, the second conductive patterns 130, and the insulating patterns 140. The first conductive layer 152 may be formed by, for example, a sputtering process, a chemical vapor deposition process, or an atomic layer deposition process. The magnetic tunnel junction layer MTJL may include a first magnetic layer ML1, a tunnel barrier layer TBL, and a second magnetic layer ML2, which are sequentially stacked on the first conductive layer 152. Each of the first magnetic layer ML1 and the second magnetic layer ML2 may include at least one magnetic layer. The tunnel barrier layer TBL may include, for example, at least one of magnesium oxide, titanium oxide, aluminum oxide, magnesium zinc oxide, or magnesium boron oxide. Each of the first magnetic layer ML1, the tunnel barrier layer TBL, and the second magnetic layer ML2 may be formed by, for example, a sputtering process or a chemical vapor deposition process.

Conductive mask patterns 165 may be formed on the magnetic tunnel junction layer MTJL. The conductive mask patterns 165 may be used to define positions and shapes of magnetic tunnel junction patterns MTJ to be described below. The conductive mask patterns 165 may include, for example, at least one of metals (e.g., Ta, W, Ru, and Ir) or conductive metal nitrides (e.g., TiN).

Figure 14A:
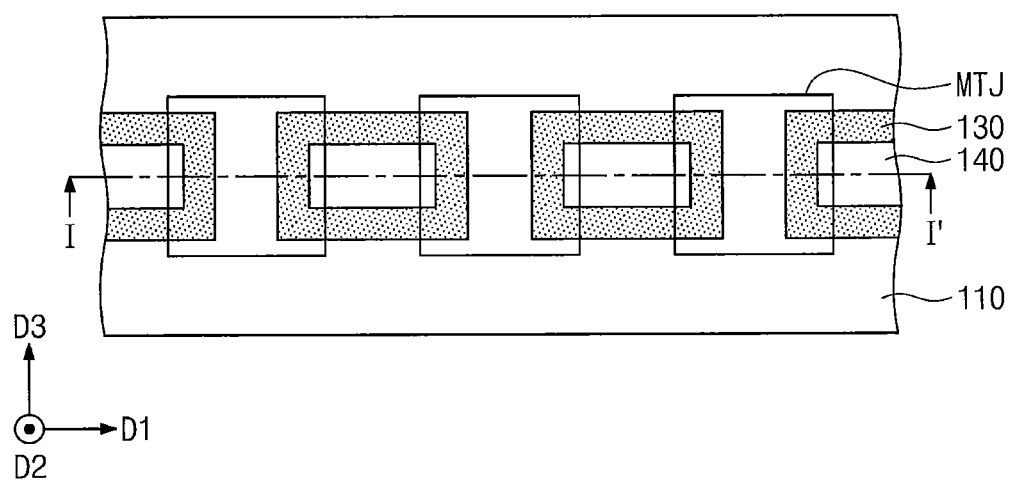
Figure 14B:
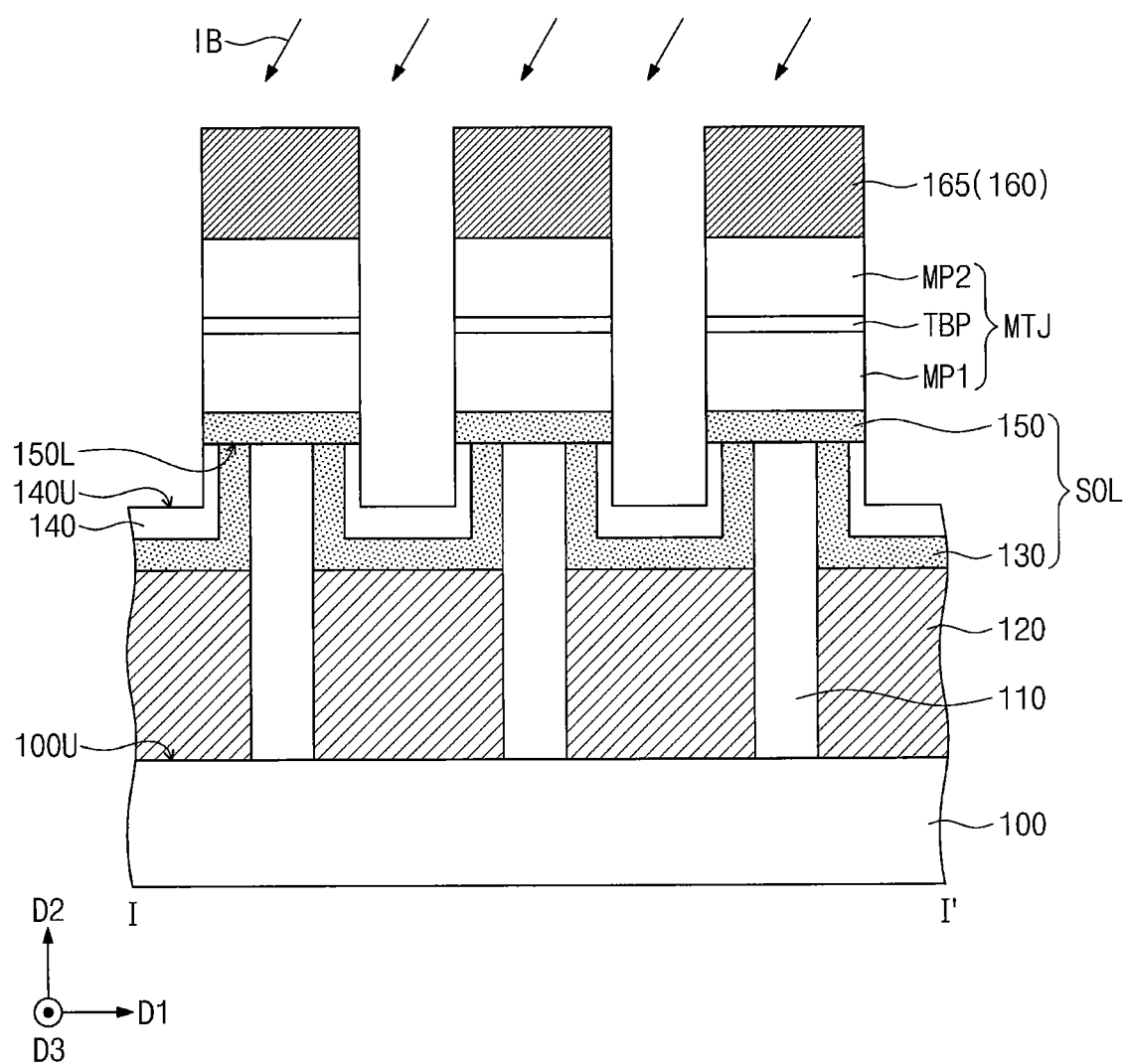

Referring to FIGS. 14A and 14B, the magnetic tunnel junction layer MTJL and the first conductive layer 152 may be sequentially etched to form the magnetic tunnel junction patterns MTJ and the first conductive patterns 150. Each of the first conductive patterns 150 may be disposed on and connected to a corresponding adjacent pair of the second conductive patterns 130. Each of the second conductive patterns 130 may be disposed below and connected to a corresponding adjacent pair of the first conductive patterns 150. An upper end of each of the second conductive patterns 130 may be in contact with a bottom surface 150L of a first conductive pattern 150. The first and second conductive patterns 150 and 130 arranged in the first direction D1 may be connected to each other, thereby constituting the conductive line SOL.

Each of the magnetic tunnel junction patterns MTJ may include the first magnetic pattern MP1, the tunnel barrier pattern TBP, and the second magnetic pattern MP2, which are sequentially stacked on each of the first conductive patterns 150. The first magnetic pattern MP1 and the second magnetic pattern MP2 may be spaced apart from each other with the tunnel barrier pattern TBP interposed therebetween.

The magnetic tunnel junction layer MTJL and the first conductive layer 152 may be etched by, for example, an ion beam etching process. The ion beam etching process may include irradiating an ion beam IB onto the substrate 100. The ion beam IB may be irradiated onto the substrate 100 in a direction inclined to the top surface 100U. The ion beam IB may include ions of an inert gas (e.g., positively ionized argon atoms (Ar$^+$)). During the ion beam etching process, the substrate 100 may be rotated about a rotating axis that is normal to the top surface 100U of the substrate 100. The conductive mask patterns 165 may be used as an etch mask during the ion beam etching process, and portions of the conductive mask patterns 165 may remain on the magnetic tunnel junction patterns MTJ, respectively, after the ion beam etching process. The remaining portions of the conductive mask patterns 165 may be used as the electrode patterns 160.

In some embodiments, a side of a magnetic tunnel junction patterns MTJ (e.g., a side of the first magnetic pattern MP1) and a side of a first conductive pattern 150 may be aligned and may form a straight side, as illustrated in FIG. 14B because the magnetic tunnel junction patterns MTJ and the first conductive pattern 150 may be formed by performing an ion beam etching process. In some embodiments, the side of the first magnetic pattern MP1 (e.g., a side of a free layer of the first magnetic pattern MP1) and the side of the first conductive pattern 150 may be coplanar. Although, FIG. 14B shows that the straight side formed of the side of the magnetic tunnel junction patterns MTJ and the side of the first conductive pattern 150 is not slanted with respect to the top surface 100U of the substrate 100, it will be understood that the straight side can be slanted with respect to the top surface 100U of the substrate 100.

An upper portion of each of the insulating patterns 140 may be recessed by the ion beam etching process. In some embodiments, the top surface 140U of each of the insulating patterns 140 may be recessed toward the substrate 100 as illustrated in FIG. 14B.

It will be understood that if an entire conductive line, which is provided to exert a spin-orbit torque on an adjacent magnetic tunnel junction pattern MTJ, is formed to have a line shape extending parallel to the top surface 100U of the substrate 100, portions of the conductive line located between the magnetic tunnel junction patterns MTJ may be etched during the ion beam etching process for forming the magnetic tunnel junction patterns MTJ. It will be also understood that the ion beam etching process may over-etch the conductive line such that the conductive line may be separated into multiple segments and thus may not be electrically connected to underlying conductive elements (e.g., lower contact plugs 120 in FIG. 2A).

According to some embodiments of the present inventive concept, the conductive line SOL may include the first and second conductive patterns 150 and 130. The first conductive patterns 150 may be provided below the magnetic tunnel junction patterns MTJ, respectively, and the second conductive patterns 130 may be provided at both sides of each of the magnetic tunnel junction patterns MTJ. Each of the second conductive patterns 130 may be formed to have a hollow pipe shape extending in the second direction D2, and the insulating patterns 140 may be formed to fill internal spaces of the second conductive patterns 130, respectively. In this case, an upper portion of each of the insulating patterns 140 may be recessed during the ion beam etching process for forming the magnetic tunnel junction patterns MTJ. However, vertical portions of the second conductive patterns 130 may not be etched by the ion beam etching process, and the second conductive patterns 130 may be connected to underlying conductive elements (e.g., lower contact plugs 120 in FIG. 2A). Thus, it is possible to reduce the number or density of defects, which may be formed in the conductive line SOL during a process of fabricating a magnetic memory device.

Referring back to FIGS. 1 and 2, the upper interlayered insulating layer 170 may be formed on the lower interlayered insulating layer 110 to cover the magnetic tunnel junction patterns MTJ and the electrode patterns 160. The upper interlayered insulating layer 170 may cover side surfaces of the magnetic tunnel junction patterns MTJ and the electrode patterns 160 and may cover the recessed top surface 140U of each of the insulating patterns 140. The upper conductive lines 200 may be formed on the upper interlayered insulating layer 170. Each of the upper conductive lines 200 may be electrically connected to a corresponding one of the magnetic tunnel junction patterns MTJ through a corresponding one of the electrode patterns 160.

In some embodiments, the ion beam etching process illustrated in FIG. 14B may etch horizontal portion HP of the second conductive patterns 130 between adjacent magnetic tunnel junction patterns MTJ until the lower contact plugs 120 are exposed such that the structure illustrated in FIGS. 4, 5A, and 5B may be formed.

Figure 15:
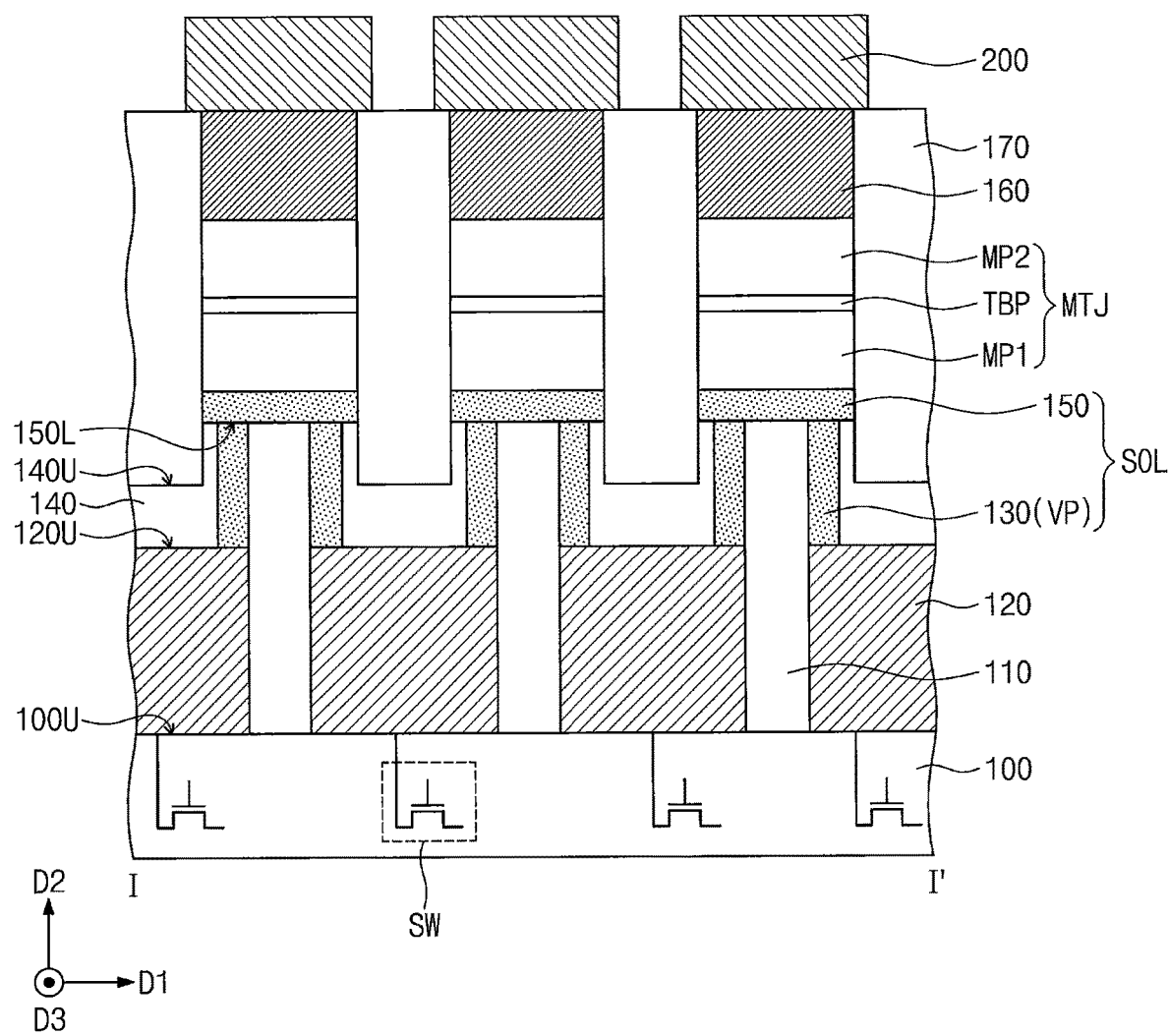
FIG. 15 is a cross-sectional view taken along the line I-I' of FIG. 1 illustrating a magnetic memory device according to some embodiments of the present inventive concept.
Figure 16:
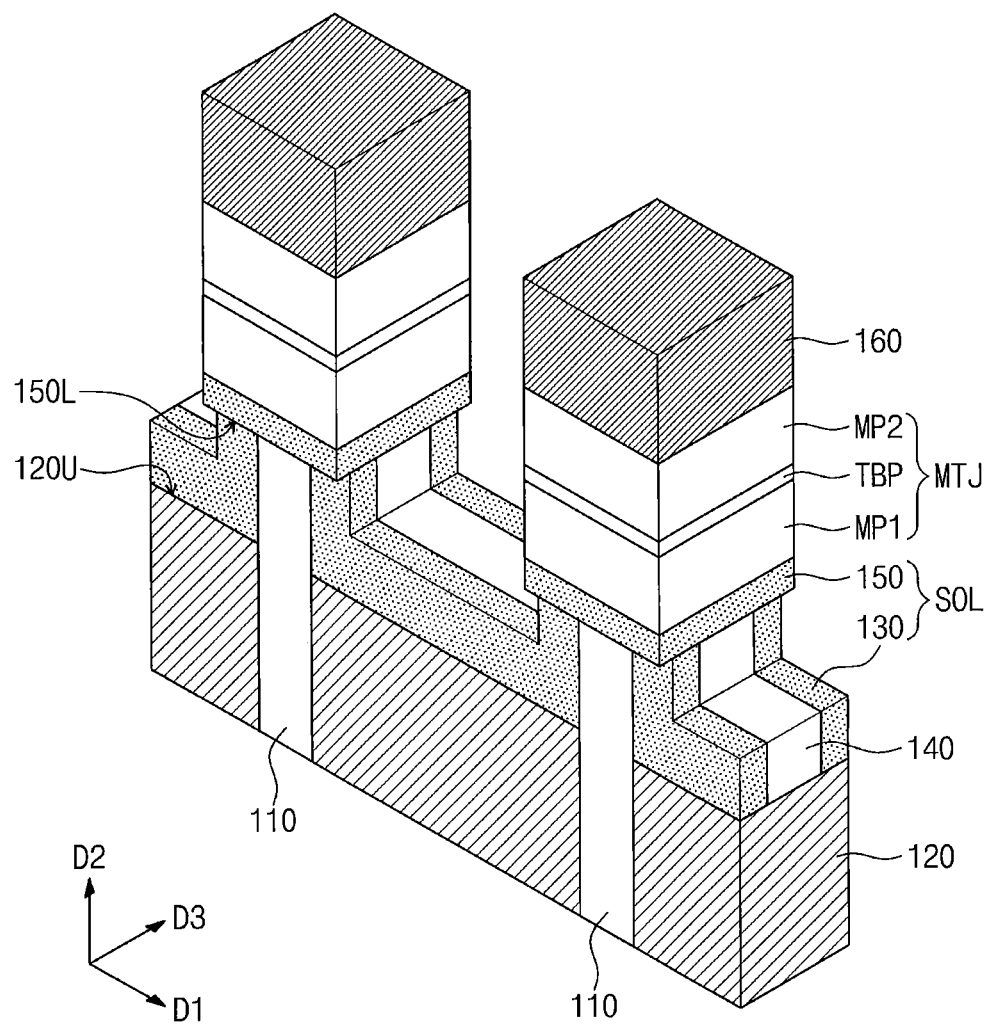
FIG. 16 is a perspective view illustrating a portion of the magnetic memory device illustrated in FIG. 15 according to some embodiments of the present inventive concept.

FIG. 15 is a cross-sectional view illustrating a magnetic memory device according to some embodiments of the present inventive concept, taken along the line I-I' of FIG. 1. FIG. 16 is a perspective view illustrating a portion of the magnetic memory device illustrated in FIG. 15 according to some embodiments of the present inventive concept. In the following description, elements previously described with reference to FIGS. 1 to 9 will be identified by the same reference numbers without repeating description thereof, for the sake of brevity.

Referring to FIGS. 1, 15, and 16, the first and second conductive patterns 150 and 130 may be alternately arranged in the first direction D1 and may be connected to each other, thereby constituting the conductive line SOL. The second conductive patterns 130 may be provided on the top surfaces 120U of the lower contact plugs 120, respectively. Each of the second conductive patterns 130 may have a ring shape, when viewed in a plan view, and may be a hollow pipe structure extending from the top surface 120U of each of the lower contact plugs 120 in the second direction D2. In some embodiments, each of the second conductive patterns 130 may be provided to have a bottom-open pipe shape, as illustrated in FIG. 16. An upper end of each of the second conductive patterns 130 may be connected to the bottom surfaces 150L of the first conductive patterns 150. As an example, the upper end of each of the second conductive patterns 130 may be in contact with the bottom surfaces 150L of the first conductive patterns 150. A lower end of each of the second conductive patterns 130 may be in contact with the top surface 120U of each of the lower contact plugs 120.

Each of the second conductive patterns 130 may include a vertical portion VP extending from the top surface 120U of each of the lower contact plugs 120 in the second direction D2. The vertical portion VP of the second conductive pattern 130 may have a ring shape, when viewed in a plan view. An upper end of the vertical portion VP of each of the second conductive patterns 130 may be connected to the bottom surface 150L of the first conductive pattern 150. As an example, the upper end of the vertical portion VP of each of the second conductive patterns 130 may be in contact with the bottom surface 150L of the first conductive pattern 150. A lower end of the vertical portion VP of each of the second conductive patterns 130 may be in contact with the top surface 120U of each of the lower contact plugs 120.

The insulating patterns 140 may be provided on the top surfaces 120U of the lower contact plugs 120, respectively. Each of the insulating patterns 140 may be provided to fill an internal space of a corresponding one of the second conductive patterns 130. In some embodiments, each of the insulating patterns 140 may be in contact with the top surface 120U of each of the lower contact plugs 120, as illustrated in FIG. 15. The vertical portion VP of each of the second conductive patterns 130 may be interposed between each of the insulating patterns 140 and the lower interlayered insulating layer 110. The top surface 140U of each of the insulating patterns 140 may be recessed toward the substrate 100.

Except for the afore described differences, the magnetic memory device illustrated in FIGS. 15 and 16 may have substantially the same features as those of the magnetic memory device previously described with reference to FIGS. 1 to 9.

FIGS. 17A to 19A are plan views illustrating a method of fabricating a magnetic memory device, according to some embodiments of the present inventive concept. FIGS. 17B to 19B are cross-sectional views taken along the lines I-I' of FIGS. 17A to 19A, respectively. In the following description, elements previously described with reference to FIGS. 10A to 14A and FIGS. 10B to 14B will be identified by the same reference numbers without repeating description thereof, for the sake of brevity.

As described with reference to FIGS. 10A and 10B, the lower interlayered insulating layer 110 may be formed on the substrate 100, and the lower contact plugs 120 may be formed in the lower interlayered insulating layer 110. The recess regions RR may be formed in the lower interlayered insulating layer 110 to expose the top surface 120U of each of the lower contact plugs 120. As described with reference to FIGS. 11A and 11B, the second conductive layer 132 may be formed on the lower interlayered insulating layer 110 to partially fill each of the recess regions RR. For example, the second conductive layer 132 may be formed to conformally cover inner surfaces of the recess regions RR.

Figure 17A:
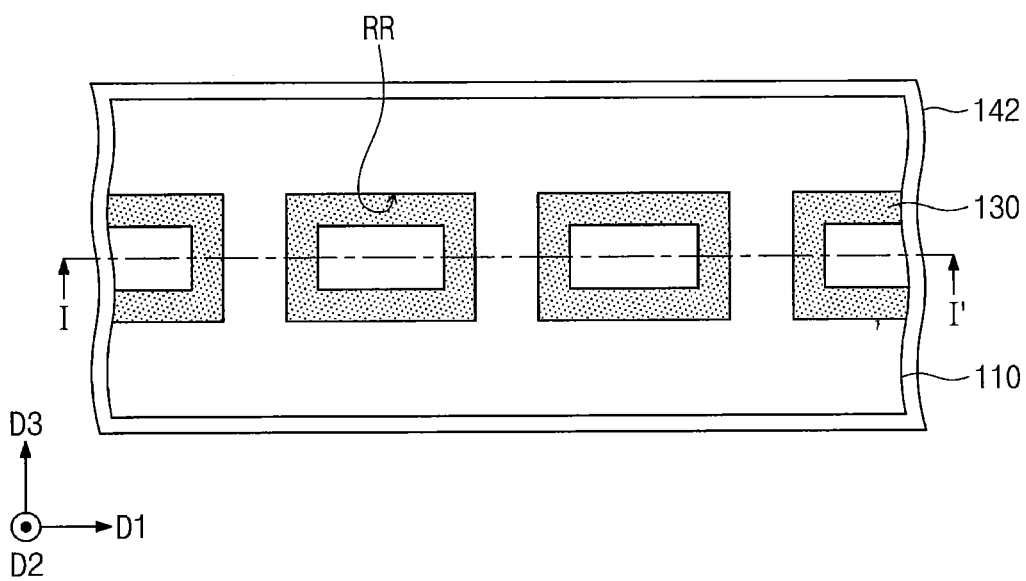
Figure 17B:
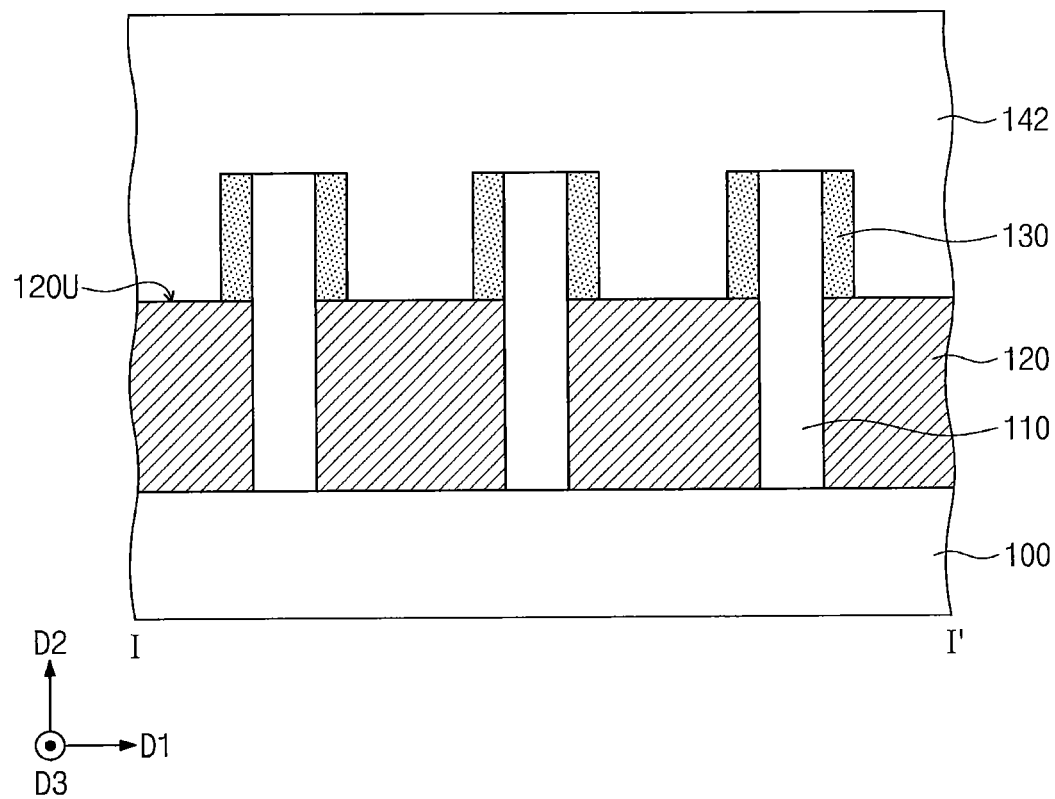

Referring to FIGS. 17A and 17B, an etching process (e.g., an anisotropic etching process) may be performed on the second conductive layer 132 to form the second conductive patterns 130. The etching process may be performed to expose the top surface 120U of each of the lower contact plugs 120 and the top surface of the lower interlayered insulating layer 110. The second conductive patterns 130 may be formed in the recess regions RR, respectively. In some embodiments, each of the second conductive patterns 130 may be locally (e.g., selectively) formed on an inner side surface of each of the recess regions RR as illustrated in FIG. 17B. As described with reference to FIGS. 1, 15, and 16, each of the second conductive patterns 130 may have a ring shape, when viewed in a plan view, and may be a hollow pipe structure extending from the top surface 120U of each of the lower contact plugs 120 in the second direction D2. Each of the second conductive patterns 130 may be formed to have a bottom-open pipe shape. After the formation of the second conductive patterns 130, the insulating layer 142 may be formed on the lower interlayered insulating layer 110. The insulating layer 142 may be formed to fill a remaining empty space of each of the recess regions RR and to be in contact with the top surfaces 120U of the lower contact plugs 120.

Figure 18A:
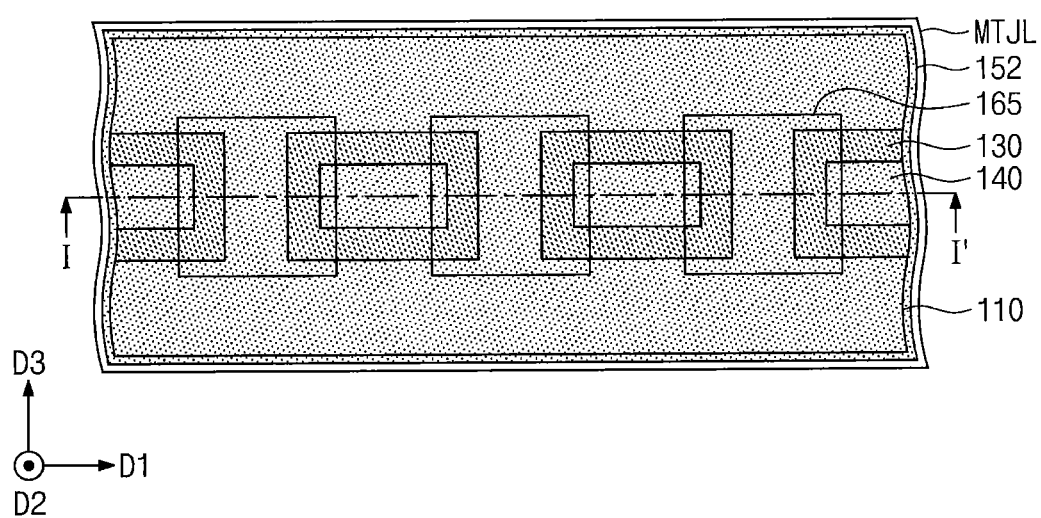
Figure 18B:
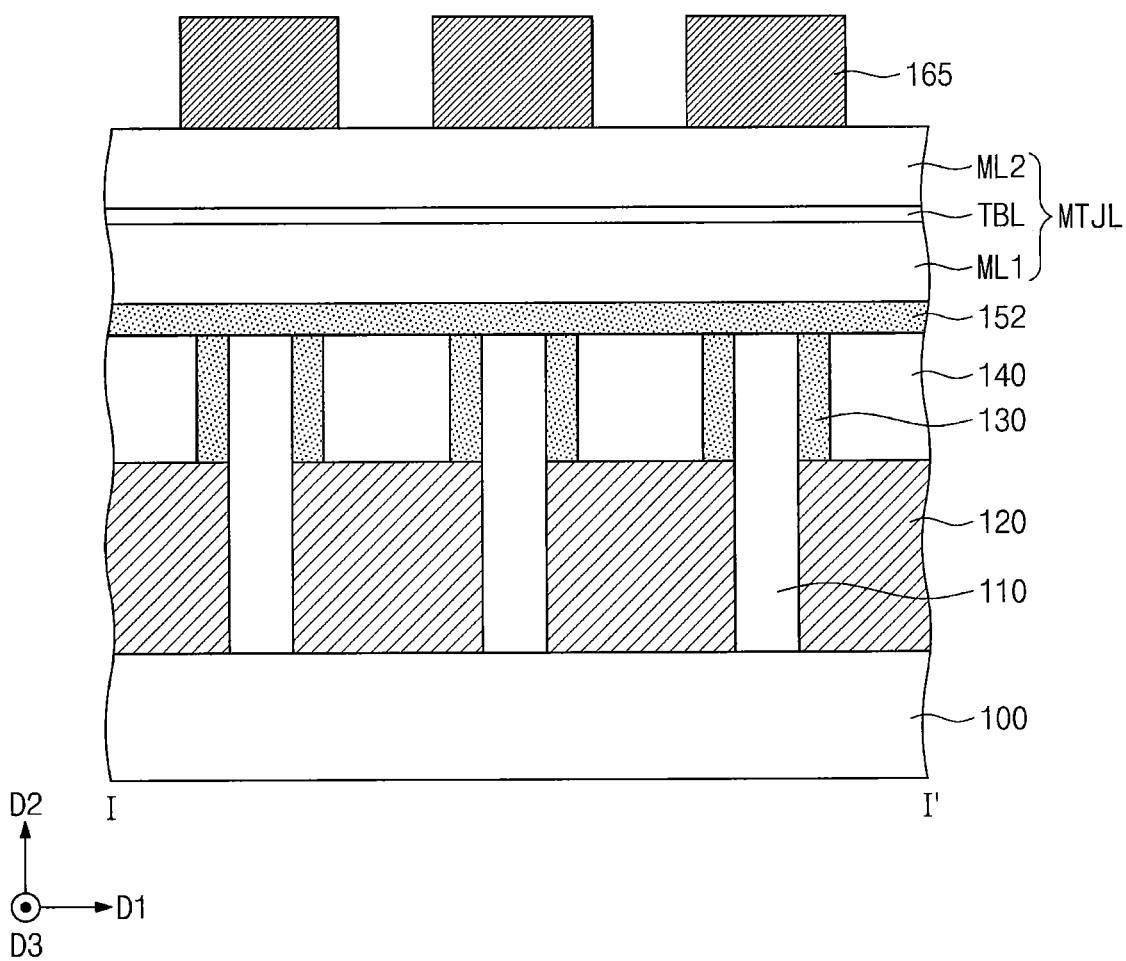

Referring to FIGS. 18A and 18B, a planarization process may be performed on the insulating layer 142. The planarization process may be performed to expose the top surface of the lower interlayered insulating layer 110. As a result of the planarization process, the insulating layer 142 may be divided into the insulating patterns 140. Each of the insulating patterns 140 may be locally (e.g., selectively) formed in each of the recess regions RR and may be in contact with the top surface 120U of each of the lower contact plugs 120. Each of the insulating patterns 140 may be formed to fill an internal space of a corresponding one of the second conductive patterns 130.

The first conductive layer 152 and the magnetic tunnel junction layer MTJL may be sequentially formed on the lower interlayered insulating layer 110. The first conductive layer 152 may be formed to cover the lower interlayered insulating layer 110, the second conductive patterns 130, and the insulating patterns 140. The conductive mask patterns 165 may be formed on the magnetic tunnel junction layer MTJL.

Figure 19A:
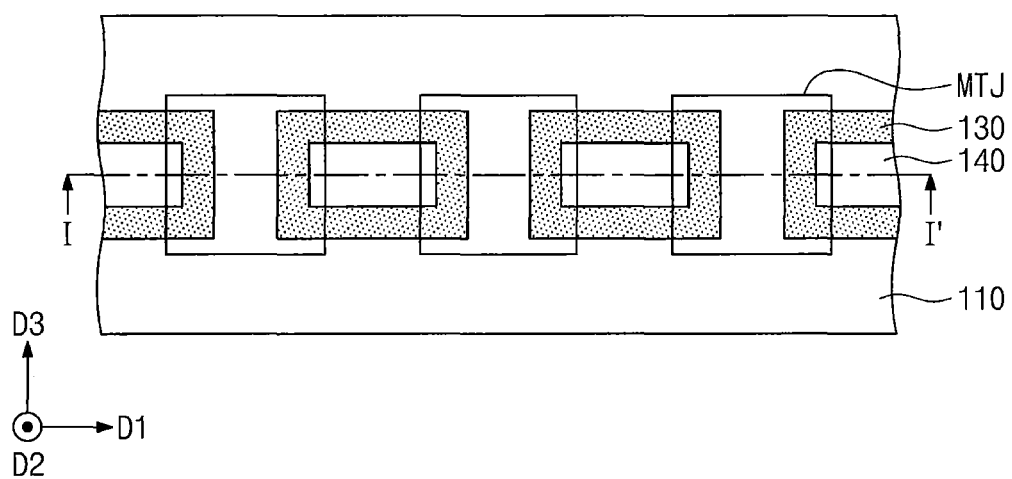
Figure 19B:
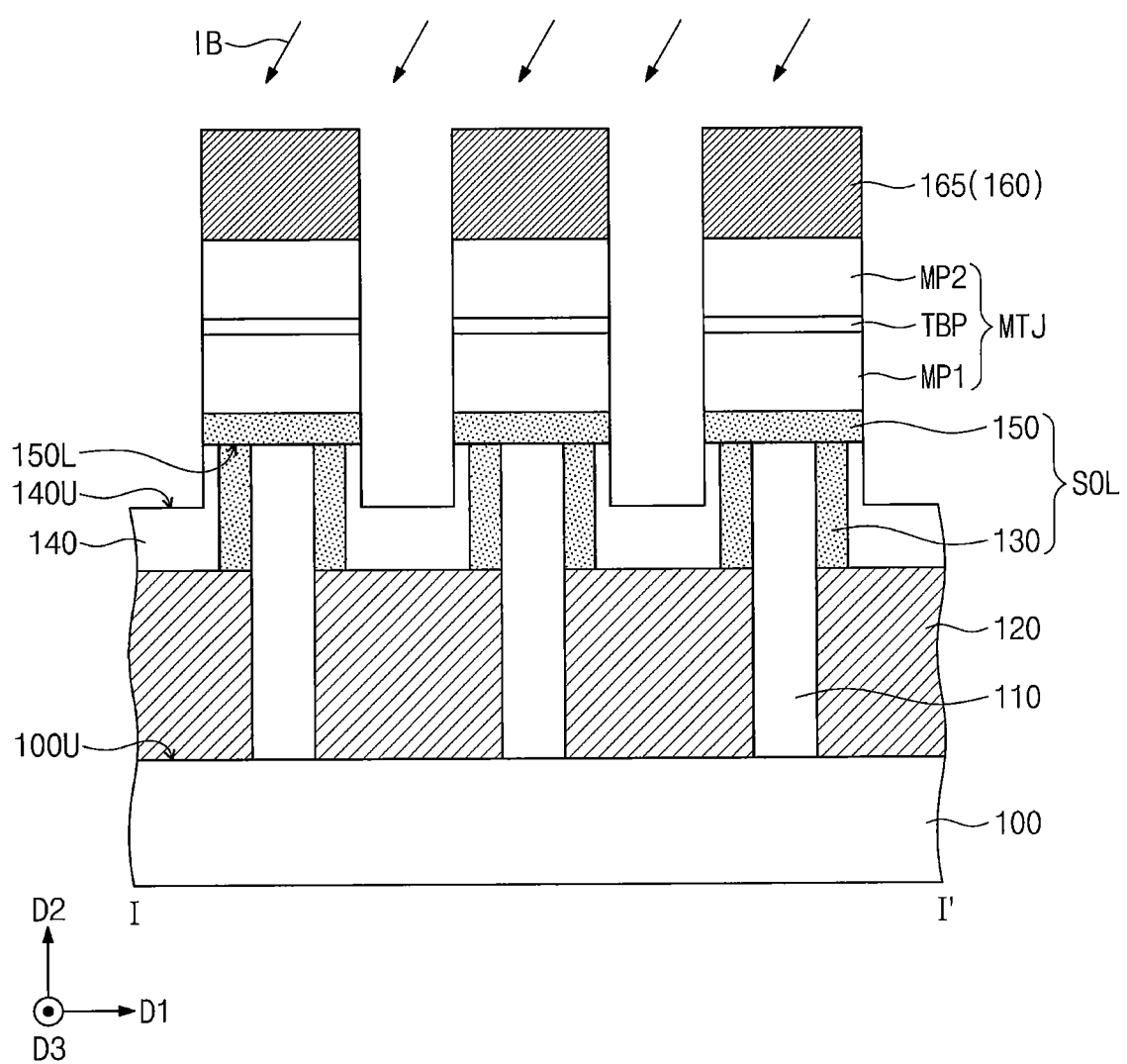

Referring to FIGS. 19A and 19B, the magnetic tunnel junction layer MTJL and the first conductive layer 152 may be sequentially etched to form the magnetic tunnel junction patterns MTJ and the first conductive patterns 150. Each of the first conductive patterns 150 may be disposed on and may be connected to a corresponding adjacent pair of the second conductive patterns 130. Each of the second conductive patterns 130 may be disposed below and may be connected to a corresponding adjacent pair of the first conductive patterns 150. An upper end of each of the second conductive patterns 130 may be in contact with a bottom surface 150L of a first conductive pattern 150. The first and second conductive patterns 150 and 130 arranged in the first direction D1 may be connected to each other, thereby constituting the conductive line SOL.

The magnetic tunnel junction layer MTJL and the first conductive layer 152 may be etched by, for example, an ion beam etching process, and the ion beam etching process may be performed to irradiate the ion beam IB onto the substrate 100. The conductive mask patterns 165 may be used as an etch mask during the ion beam etching process, and portions of the conductive mask patterns 165 may remain on the magnetic tunnel junction patterns MTJ, respectively, after the ion beam etching process. The remaining portions of the conductive mask patterns 165 may be used as the electrode patterns 160.

An upper portion of each of the insulating patterns 140 may be recessed by the ion beam etching process. For example, the top surface 140U of each of the insulating patterns 140 may be recessed toward the substrate 100.

The subsequent processes may be performed in substantially the same manner as those in the method described with reference to FIGS. 10A to 14A and FIGS. 10B to 14B.

According to some embodiments of the present inventive concept, the conductive line SOL may be provided below the magnetic tunnel junction patterns MTJ and may be configured to exert a spin-orbit torque on the magnetic tunnel junction patterns MTJ (e.g., a free layer of the magnetic tunnel junction patterns MTJ). The conductive line SOL may include the first conductive patterns 150, which are respectively provided below the magnetic tunnel junction patterns MTJ, and the second conductive patterns 130, which are provided at both sides of each of the magnetic tunnel junction patterns MTJ. Each of the second conductive patterns 130 may have a hollow pipe shape extending in a direction normal to the top surface 100U of the substrate 100, and the insulating patterns 140 may be provided to fill internal spaces of the second conductive patterns 130, respectively. In this case, vertical portions VP of the conductive patterns 130 may not be completely etched during the ion beam etching process for forming the magnetic tunnel junction patterns MTJ. Thus, it is possible to reduce the number or density of defects, which may be formed in the conductive line SOL during a process of fabricating a magnetic memory device.

According to some embodiments of the present inventive concept, it may be possible to reduce a defect in a conductive line, which is provided below magnetic tunnel junction patterns to exert a spin-orbit torque on the magnetic tunnel junction patterns. In addition, it may be possible to reduce difficulty in forming the conductive line. That is, a magnetic memory device with a reduced defect density can be easily fabricated by methods according to some embodiments of the present inventive concept.

While some example embodiments of the present inventive concept have been shown and described, it will be understood by one of ordinary skill in the art that variations in form and detail may be made therein without departing from the spirit and scope of the attached claims. Therefore, the above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A magnetic random access memory (MRAM) device comprising:
 a magnetic tunnel junction (MTJ) including a free layer and a pinned layer sequentially stacked in a vertical direction; and
 a conductive layer adjacent to the free layer of the MTJ, wherein the conductive layer comprises:
 a horizontal portion; and
 first and second protruding portions that protrude away from the horizontal portion and are spaced apart from each other in a horizontal direction that is perpendicular to the vertical direction,
 wherein a side of the free layer and a side of the horizontal portion form a straight side.

2. The MRAM device of claim 1, wherein the horizontal portion is configured to exert spin-orbit torque to the free layer when current flows in the horizontal direction from the first protruding portion to the second protruding portion.

3. The MRAM device of claim 1, wherein the horizontal portion comprises a material different from the first and second protruding portions.

4. The MRAM device of claim 1, wherein the MTJ overlaps the first and second protruding portions.

5. The MRAM device of claim 1, wherein a side of the first protruding portion is recessed toward the second protruding portion with respect to the side of the horizontal portion in a plan view.

6. The MRAM device of claim 1, further comprising first and second conductive contacts that are spaced apart from each other in the horizontal direction and are connected to the first and second protruding portions, respectively,
 wherein the conductive layer is between the MTJ and the first and second conductive contacts.

7. A magnetic random access memory (MRAM) device comprising:
 a magnetic tunnel junction (MTJ) including a free layer and a pinned layer sequentially stacked in a vertical direction; and
 a conductive layer adjacent to the free layer of the MTJ, wherein the conductive layer comprises:
 a horizontal portion comprising a first surface facing the MTJ and a second surface opposite the first surface; and
 first and second protruding portions that protrude away from the second surface of the horizontal portion and are spaced apart from each other in a horizontal direction that is perpendicular to the vertical direction,
 wherein the first protruding portion comprises a first side facing the second protruding portion and a second side opposite the first side of the first protruding portion, and
 wherein the second side of the first protruding portion is recessed toward the second protruding portion with respect to a side of the horizontal portion in a plan view.

8. The MRAM device of claim 7, wherein a side of the free layer of the MTJ and the side of the horizontal portion of the conductive layer are aligned.

9. The MRAM device of claim 8, wherein a portion of the second side of the first protruding portion is aligned with the sides of the free layer of the MTJ and the horizontal portion of the conductive layer.

10. The MRAM device of claim 7, wherein the free layer is between the horizontal portion of the conductive layer and the pinned layer.

11. The MRAM device of claim 7, wherein the second protruding portion comprises a first side facing the first protruding portion and a second side opposite the first side of the second protruding portion,
 wherein the side of the horizontal portion comprises a first side, and the horizontal portion further comprises a second side opposite the first side of the horizontal portion, and wherein the second side of the second protruding portion is recessed toward the first protruding portion with respect to the second side of the horizontal portion in the plan view.

12. The MRAM device of claim 7, wherein the MTJ overlaps an entirety of an interface between the horizontal portion and the first protruding portion.

13. The MRAM device of claim 7, further comprising first and second conductive contacts that are spaced apart from each other in the horizontal direction and are spaced apart from the horizontal portion of the conductive layer in the vertical direction,
wherein the first protruding portion electrically connects the first conductive contact to the horizontal portion, and the second protruding portion electrically connects the second conductive contact to the horizontal portion.

14. The MRAM device of claim 13, wherein the MTJ comprises a first MTJ, and the conductive layer comprises a first conductive layer, and
wherein the MRAM device further comprises:
a second MTJ spaced apart from the first MTJ in the horizontal direction; and
a second conductive layer adjacent to the second MTJ,
wherein the first conductive contact is electrically connected to the first conductive layer and the second conductive layer.

15. A magnetic random access memory (MRAM) device comprising:
a magnetic tunnel junction (MTJ) including a free layer and a pinned layer sequentially stacked in a vertical direction; and
a conductive layer adjacent to the free layer of the MTJ, wherein the conductive layer comprises:
a horizontal portion comprising a first surface facing the MTJ and a second surface opposite the first surface; and
first and second protruding portions that protrude away from the second surface of the horizontal portion and are spaced apart from each other in a horizontal direction that is perpendicular to the vertical direction,
wherein the MTJ overlaps an interface between the horizontal portion and the first protruding portion.

16. The MRAM device of claim 15, wherein the MTJ overlaps an entirety of the interface between the horizontal portion and the first protruding portion.

17. The MRAM device of claim 15, wherein a side of the free layer and a side of the horizontal portion are coplanar.

18. The MRAM device of claim 17, wherein the first protruding portion comprises a first side facing the second protruding portion and a second side opposite the first side of the first protruding portion, and
wherein the second side of the first protruding portion is recessed toward the second protruding portion with respect to the side of the horizontal portion in a plan view.

19. The MRAM device of claim 15, wherein the horizontal portion is configured to exert spin-orbit torque to the free layer when current flows in the horizontal direction from the first protruding portion to the second protruding portion.

20. The MRAM device of claim 15, wherein the MTJ overlaps an interface between the horizontal portion of the conductive layer and the second protruding portion.

* * * * *